(12) United States Patent
Kim et al.

(10) Patent No.: US 12,381,185 B2
(45) Date of Patent: Aug. 5, 2025

(54) SEMICONDUCTOR PACKAGES

(71) Applicant: Samsung Electronics Co., Ltd., Suwon-si (KR)

(72) Inventors: Juhyeon Kim, Cheonan-si (KR); Hyoeun Kim, Cheonan-Si (KR); Sunkyoung Seo, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 496 days.

(21) Appl. No.: 17/836,142

(22) Filed: Jun. 9, 2022

(65) Prior Publication Data

US 2023/0118535 A1 Apr. 20, 2023

(30) Foreign Application Priority Data

Oct. 14, 2021 (KR) ........................ 10-2021-0136960

(51) Int. Cl.
*H01L 25/065* (2023.01)
*H01L 23/00* (2006.01)
(Continued)

(52) U.S. Cl.
CPC ...... *H01L 25/0657* (2013.01); *H01L 23/3157* (2013.01); *H01L 23/481* (2013.01); *H01L 23/49816* (2013.01); *H01L 23/528* (2013.01); *H01L 23/544* (2013.01); *H01L 24/08* (2013.01); *H01L 24/16* (2013.01); *H01L 24/05* (2013.01); *H01L 24/13* (2013.01); *H01L 24/81* (2013.01); *H01L 2223/54426* (2013.01); *H01L 2224/02331* (2013.01); *H01L 2224/05624* (2013.01); *H01L 2224/05647* (2013.01); *H01L 2224/05655* (2013.01); *H01L 2224/06177* (2013.01); *H01L 2224/08145* (2013.01);
(Continued)

(58) Field of Classification Search
CPC .... H01L 25/0657; H01L 23/258; H01L 23/31
See application file for complete search history.

(56) References Cited

U.S. PATENT DOCUMENTS 7,786,584 B2  8/2010  Barth et al.
9,053,953 B1  6/2015  Lee et al.
(Continued)

*Primary Examiner* — Dale E Page
*Assistant Examiner* — Wilner Jean Baptiste
(74) *Attorney, Agent, or Firm* — MORGAN, LEWIS & BOCKIUS LLP

(57) ABSTRACT

A semiconductor package may include a redistribution substrate, a first semiconductor chip on the redistribution substrate, and a second semiconductor chip between the redistribution substrate and the first semiconductor chip. The second semiconductor chip may have a width in a first direction that is smaller than a width of the first semiconductor chip in the first direction. The first semiconductor chip may include a first alignment key pattern on a bottom surface thereof. The second semiconductor chip may be spaced apart from the first alignment key pattern. The second semiconductor chip may include a second interconnection layer on the bottom surface of the first semiconductor chip, a second semiconductor substrate on a bottom surface of the second interconnection layer and exposing a bottom surface of an edge region of the second interconnection layer, and a second alignment key pattern on the edge region of the second interconnection layer.

20 Claims, 16 Drawing Sheets

(51) Int. Cl.
*H01L 23/31* (2006.01)
*H01L 23/48* (2006.01)
*H01L 23/498* (2006.01)
*H01L 23/528* (2006.01)
*H01L 23/544* (2006.01)

(52) U.S. Cl.
CPC ............ *H01L 2224/13147* (2013.01); *H01L 2224/16235* (2013.01); *H01L 2224/81447* (2013.01)

(56) References Cited

U.S. PATENT DOCUMENTS

| | | |
|---|---|---|
| 10,756,010 B2 | 8/2020 | Yu et al. |
| 10,797,001 B2 | 10/2020 | Chen et al. |
| 11,037,904 B2 | 6/2021 | Yu et al. |
| 2010/0007017 A1* | 1/2010 | Wei ...................... H01L 23/145 |
| | | 257/737 |
| 2015/0001686 A1 | 1/2015 | Xue |
| 2020/0013754 A1 | 1/2020 | Gao et al. |
| 2020/0043861 A1* | 2/2020 | Chen ....................... H01L 24/20 |
| 2021/0193581 A1* | 6/2021 | Seo .................... H01L 23/5386 |

* cited by examiner

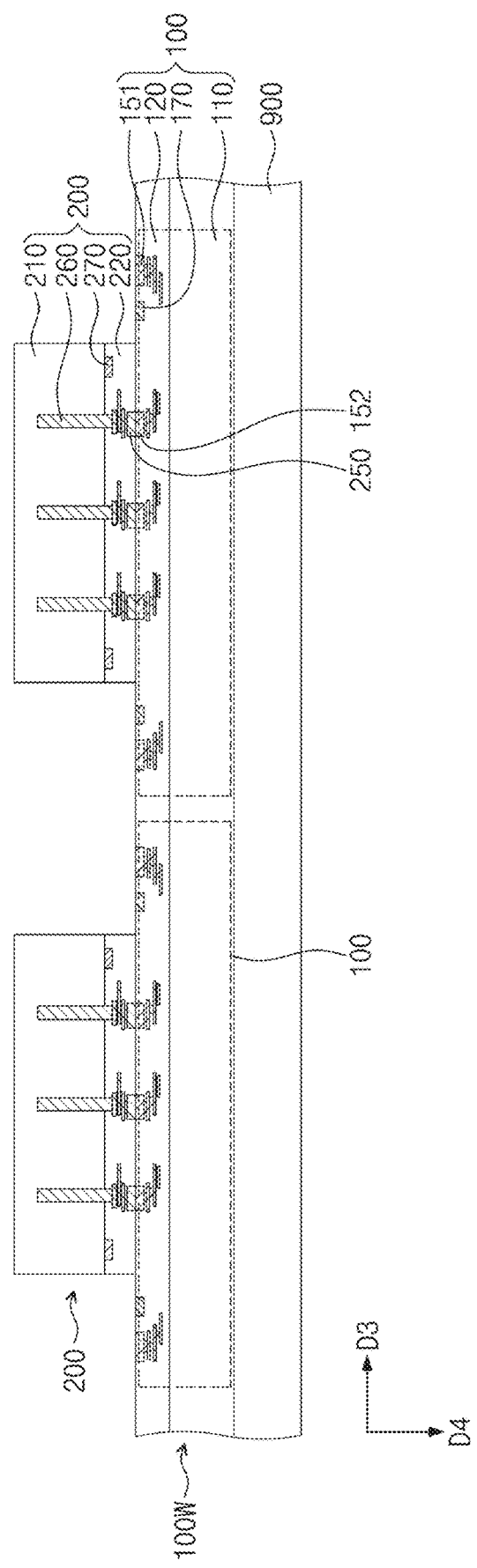

SEMICONDUCTOR PACKAGES

CROSS-REFERENCE TO RELATED APPLICATION(S)

This U.S. non-provisional patent application claims priority under 35 U.S.C. § 119 to Korean Patent Application No. 10-2021-0136960, filed on Oct. 14, 2021, in the Korean Intellectual Property Office, the entire contents of which are hereby incorporated by reference.

TECHNICAL FIELD

The present disclosure relates to semiconductor packages including alignment key patterns.

BACKGROUND

A semiconductor package includes a semiconductor chip that may be provided in a form that enables the chip to be used more easily as a part of an electronic product. In general, the semiconductor package includes a printed circuit board (PCB) and a semiconductor chip, which is mounted on the PCB and is electrically connected to the PCB using bonding wires or bumps. With development of the electronic industry, various studies are being conducted to realize more highly-reliable, highly-integrated, and/or small-sized semiconductor packages.

SUMMARY

Some embodiments of the inventive concepts provide semiconductor packages configured to allow for more accurate inspection, e.g., more highly-accurate inspection.

According to some embodiments of the inventive concepts, a semiconductor package may include a redistribution substrate, a first semiconductor chip on the redistribution substrate, and a second semiconductor chip between the redistribution substrate and the first semiconductor chip, the second semiconductor chip having a second width in a first horizontal direction that is smaller than a first width of the first semiconductor chip in the first horizontal direction. The first semiconductor chip may include a first alignment key pattern on a bottom surface thereof. The second semiconductor chip may be spaced apart from the first alignment key pattern. The second semiconductor chip may include a second interconnection layer on the bottom surface of the first semiconductor chip, a second semiconductor substrate on a bottom surface of the second interconnection layer and exposing a bottom surface of an edge region of the second interconnection layer, and a second alignment key pattern on the edge region of the second interconnection layer.

According to some embodiments of the inventive concepts, a semiconductor package may include a first semiconductor chip including a first semiconductor substrate, a first interconnection layer on a bottom surface of the first semiconductor substrate, and a first alignment key pattern on a bottom surface of an edge region of the first interconnection layer, and a second semiconductor chip on a bottom surface of the first interconnection layer and exposing the first alignment key pattern. The second semiconductor chip may include a second interconnection layer that faces the first interconnection layer, a second semiconductor substrate on a bottom surface of the second interconnection layer and exposing a bottom surface of an edge region of the second interconnection layer, and a second alignment key pattern on the edge region of the second interconnection layer.

According to some embodiments of the inventive concepts, a semiconductor package may include a redistribution substrate, solder balls on a bottom surface of the redistribution substrate, a first semiconductor chip on a top surface of the redistribution substrate, a second semiconductor chip between the redistribution substrate and the first semiconductor chip, and an insulating sealing layer between the top surface of the redistribution substrate and a bottom surface of the first semiconductor chip and covering side surfaces of the second semiconductor chip. The first semiconductor chip may include a first semiconductor substrate, a first interconnection layer on a bottom surface of the first semiconductor substrate, a first bonding chip pad provided on a bottom surface of a center region of the first interconnection layer, and a first metal dummy pattern provided on a bottom surface of an edge region of the first interconnection layer and electrically isolated from the first bonding chip pad. The second semiconductor chip may be spaced apart from the edge region of the first interconnection layer, when viewed in a plan view. The second semiconductor chip may include a second interconnection layer on the bottom surface of the center region of the first interconnection layer, a second semiconductor substrate on a bottom surface of the second interconnection layer exposing a bottom surface of an edge region of the second interconnection layer, a penetration via in the second semiconductor substrate, a second chip pad on a top surface of the second interconnection layer, and a second metal dummy pattern provided on the edge region of the second interconnection layer and electrically disconnected from the second chip pad.

BRIEF DESCRIPTION OF THE DRAWINGS

FIGS. 5A, 5B, 5E, 5F, 5G, and 5H are sectional views illustrating a method of fabricating a semiconductor package, according to some embodiments of the inventive concepts.

DETAILED DESCRIPTION

Some examples of embodiments of the inventive concepts will now be described more fully with reference to the accompanying drawings, in which the examples of embodiments are shown.

Figure 1A:
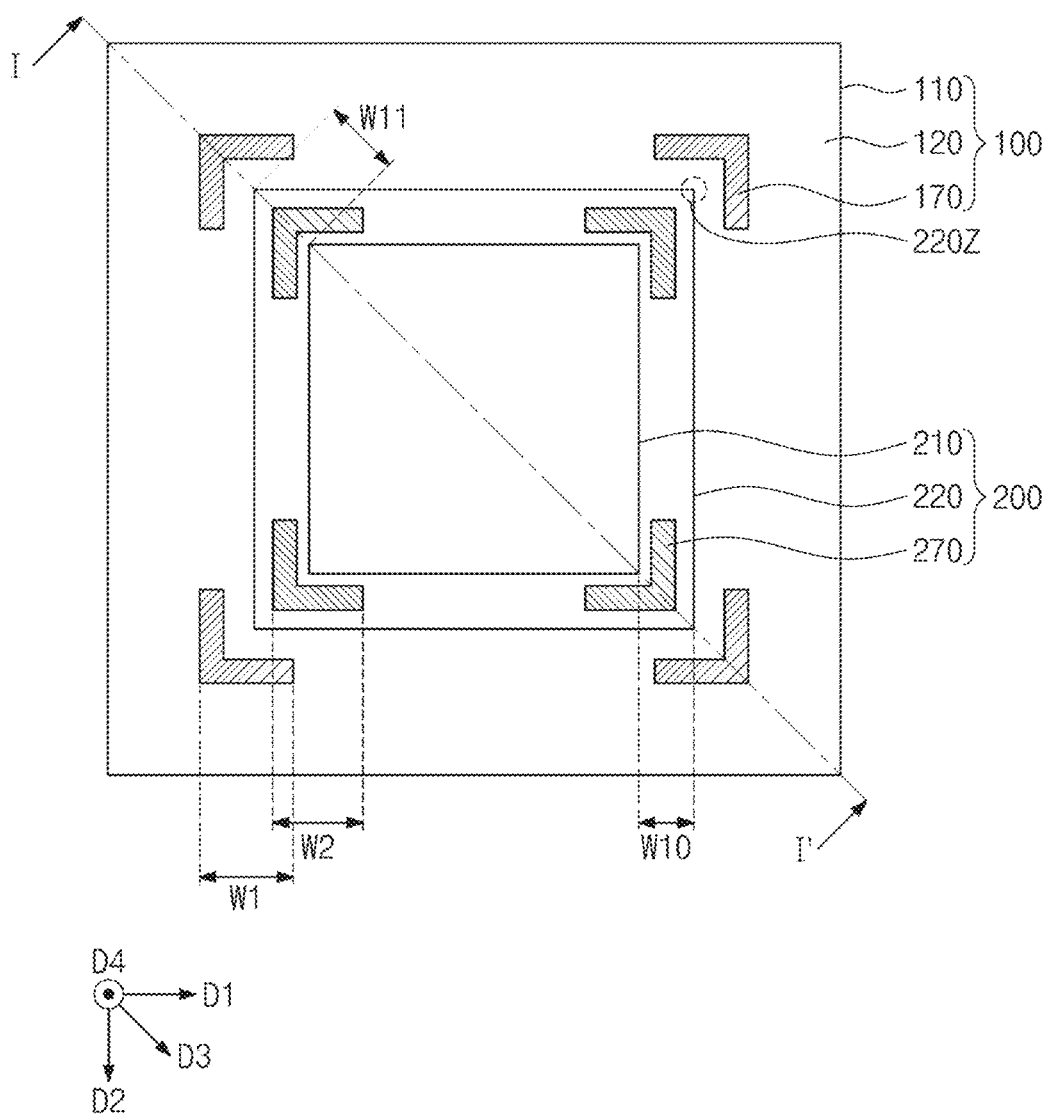
FIG. 1A is a diagram illustrating a first alignment key pattern of a first semiconductor chip and a second alignment key pattern of a second semiconductor chip, according to some embodiments of the present inventive concepts.
Figure 1B:
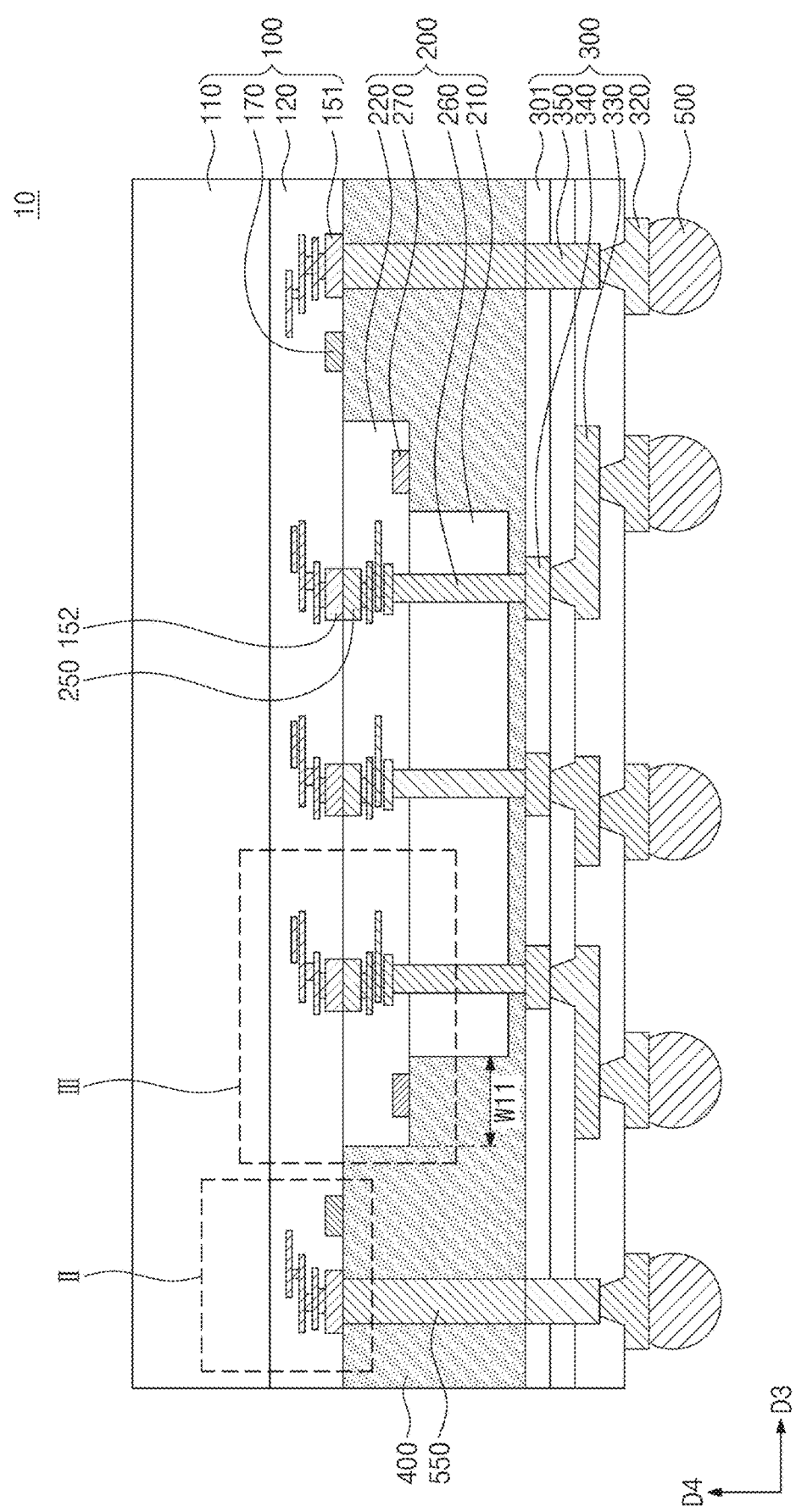
FIG. 1B is a sectional view, which is taken along a line I-I' of FIG. 1A to illustrate a semiconductor package according to some embodiments of the inventive concepts.
Figure 1C:
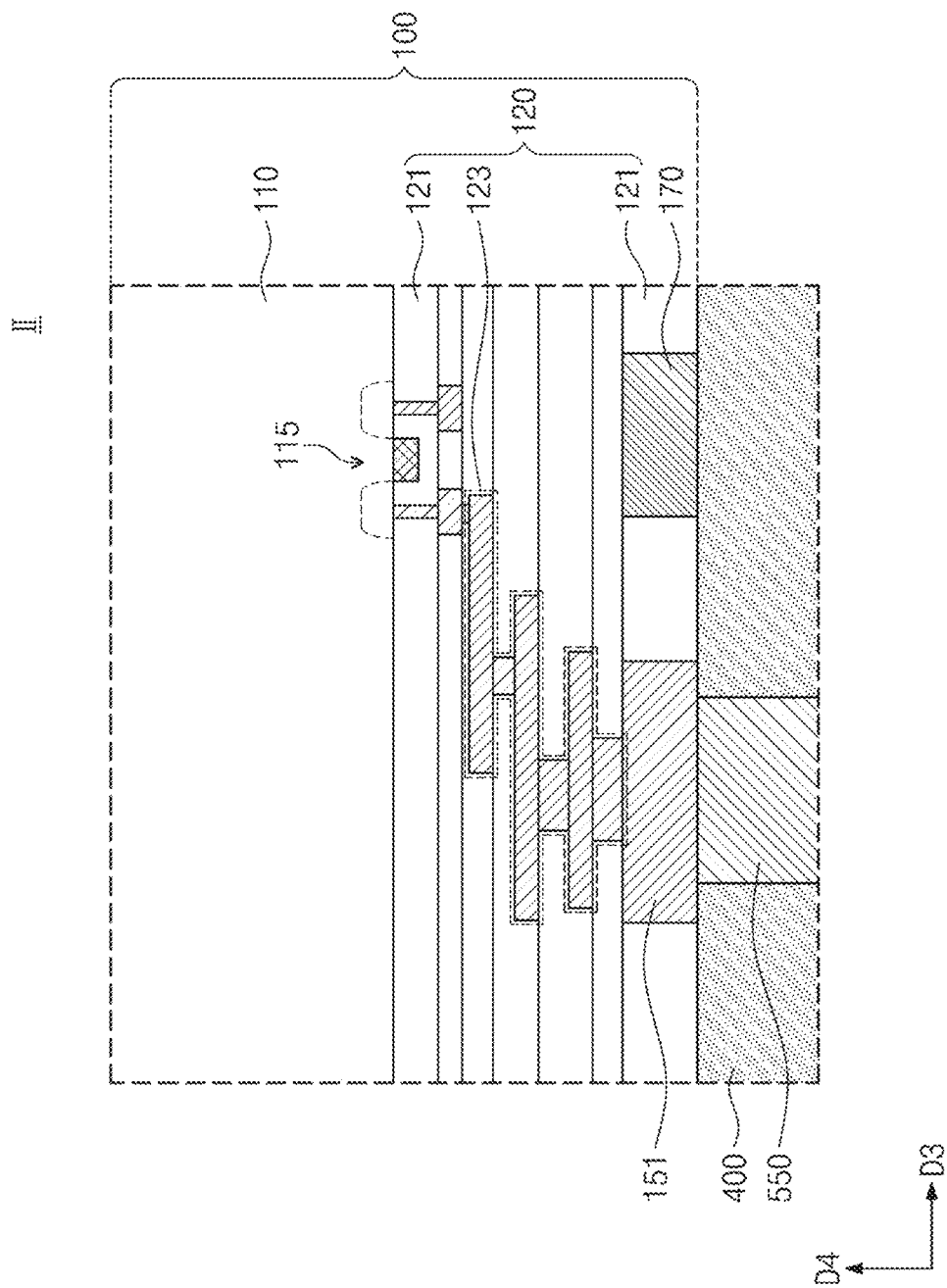
FIG. 1C is an enlarged sectional view illustrating a portion 'II' of FIG. 1B.
Figure 1D:
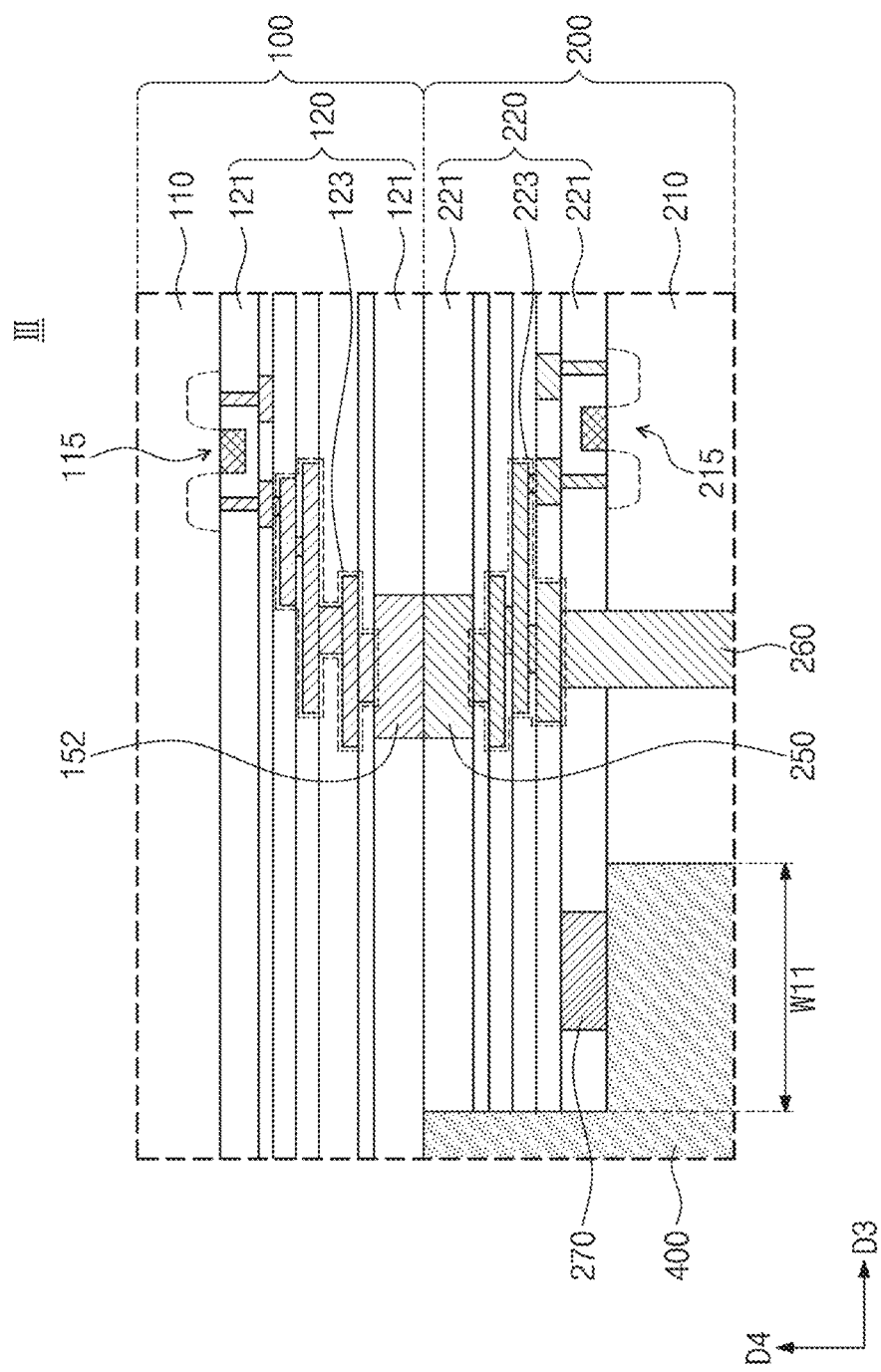
FIG. 1D is an enlarged sectional view illustrating a portion 'III' of FIG. 1B.

FIG. 1A is a diagram illustrating a first alignment key pattern of a first semiconductor chip and a second alignment key pattern of a second semiconductor chip, according to some embodiments of the inventive concepts. FIG. 1B is a sectional view, which is taken along a line I-I' of FIG. 1A to illustrate a semiconductor package according to some embodiments of the inventive concepts. FIG. 1C is an enlarged sectional view illustrating a portion 'II' of FIG. 1B. FIG. 1D is an enlarged sectional view illustrating a portion 'III' of FIG. 1B.

Referring to FIGS. 1A to 1D, a semiconductor package 10 may include a redistribution substrate 300, solder balls 500, a first semiconductor chip 100, a second semiconductor chip 200, conductive structures 550, and an insulating sealing layer 400.

As shown in FIG. 1B, the redistribution substrate 300 may have a top surface and a bottom surface, which are opposite to each other. The redistribution substrate 300 may include one or more organic insulating layers 301, first conductive patterns 320, second conductive patterns 330, third conductive patterns 340, and fourth conductive patterns 350. The organic insulating layer 301 may be formed of or include an organic material (e.g., a photoimageable dielectric (PID) material). The PID material may be a polymer. For example, the PID material may be formed of, or may include, at least one of photosensitive polyimide, polybenzoxazole, phenol-based polymers, or benzocyclobutene-based polymers. In some embodiments, a plurality of the organic insulating layers 301 may be provided. The number of the organic insulating layers 301 stacked may be variously changed, and the thicknesses of the organic insulating layers 310 may be variously changed. In some embodiments, the organic insulating layers 301 may be formed of or include the same material. There may be no observable interface between adjacent ones of the organic insulating layers 301.

The first conductive patterns 320 may be provided on a bottom surface of the organic insulating layer 301, e.g., a lowermost one of the plurality of organic insulating layers 301. The first conductive patterns 320 may be further extended into the lowermost one of the organic insulating layers 301 from the bottom surface of the organic insulating layer 301. The first conductive patterns 320 may be used as solder pads. The second conductive patterns 330 may be provided on and electrically connected to the first conductive patterns 320, respectively. The second conductive patterns 330 may be redistribution patterns. The second conductive patterns 330 may be provided between or in the organic insulating layers 301. The third conductive patterns 340 may be provided on and electrically connected to the second conductive patterns 330, respectively. The third conductive patterns 340 may be provided in an uppermost one of the organic insulating layers 301.

The fourth conductive patterns 350 may be provided in an edge region of the redistribution substrate 300. The fourth conductive patterns 350 may be extend through and/or penetrate the organic insulating layers 301. The fourth conductive patterns 350 may be laterally spaced apart from and electrically disconnected or isolated from second conductive patterns 330. The fourth conductive patterns 350 may be provided on the first conductive patterns 320, respectively. In some embodiments, and unlike that illustrated in the drawings, each of the fourth conductive patterns 350 may include a plurality of conductive vias rather than having a monolithic form. The conductive vias may be provided to penetrate each of the organic insulating layers 301. The shapes of the first to fourth conductive patterns 320, 330, 340, and 350 may be variously changed. The first to fourth conductive patterns 320, 330, 340, and 350 may be formed of or include a metallic material (e.g., copper). Electrical connection with the redistribution substrate 300 may mean electrical connection with at least one of the first to fourth conductive patterns 320, 330, 340, and 350.

Although not shown, first seed patterns may be further provided on top surfaces of the first conductive patterns 320. Second seed patterns (not shown) may be further provided between the first conductive patterns 320 and the second conductive patterns 330. Third seed patterns (not shown) may be further provided between the second conductive patterns 330 and the third conductive patterns 340. The first to third seed patterns may be formed of or include a metallic material that is different from the material of the first to fourth conductive patterns 320, 330, 340, and 350. For example, the first to third seed patterns may be formed of or include at least one of titanium, copper, and/or alloys thereof.

The solder balls 500 may be provided on the bottom surface of the redistribution substrate 300. The solder balls 500 may be provided on bottom surfaces of the first conductive patterns 320 and may be electrically connected to the third conductive patterns 340. The first conductive patterns 320 may serve as pads of the solder balls 500. The solder balls 500 may be formed of or include at least one solder material (e.g., tin, lead, silver, and/or alloys thereof).

The first semiconductor chip 100 may be provided on or above the top surface of the redistribution substrate 300. The first semiconductor chip 100 may be a logic chip. The first semiconductor chip 100 may include a first semiconductor substrate 110, a first integrated circuit 115, a first interconnection layer 120, first conductive chip pads 151, first bonding chip pads 152, and a first alignment key pattern 170. The first semiconductor substrate 110 may be formed of or include silicon, germanium, or silicon germanium. The first semiconductor substrate 110 may have a crystalline structure.

A first direction D1 may be parallel to a top surface of the first semiconductor chip 100. The top surface of the first semiconductor chip 100 may be a top surface of the first semiconductor substrate 110. A second direction D2 may be parallel to the top surface of the first semiconductor chip 100 and may be substantially perpendicular to the first direction D1. A third direction D3 may be parallel to the top surface of the first semiconductor chip 100 and may be inclined at an angle to both the first and second directions D1 and D2. The third direction D3 may be coplanar with and intersecting both the first direction D1 and the second direction D2. The third direction D3 may be a diagonal direction. A fourth direction D4 may be substantially perpendicular to the top surface of the first semiconductor chip 100. The fourth direction D4 may be substantially perpendicular to the first direction D1, the second direction D2, and the third direction D3. The fourth direction D4 may be a vertical direction. Herein, if two elements are described as laterally spaced apart from each other, they may be spaced apart from each other in a horizontal direction. Here, the horizontal direction may be chosen to be parallel to the top surface of the first semiconductor chip 100. In some embodiments, the horizontal direction may be parallel to one of the first, second, and third directions D1, D2, and D3.

The first interconnection layer 120 may be provided on a bottom surface of the first semiconductor substrate 110, e.g., a surface facing the redistribution substrate 300. The first interconnection layer 120 may have side surfaces that are vertically aligned to side surfaces of the first semiconductor substrate 110. Herein, the term "vertical" may be used to represent the fourth direction D4 or a direction parallel to the fourth direction D4. A width of the first interconnection layer 120 may be equal to a width of the first semiconductor substrate 110. The first interconnection layer 120 may have a center region and an edge region, when viewed in a plan view. The edge region of the first interconnection layer 120 may be provided to enclose the center region, when viewed in the plan view. The edge region of the first interconnection layer 120 may be provided between the side surfaces of the first interconnection layer 120 and the center region of the first interconnection layer 120.

The first bonding chip pads 152 and the first conductive chip pads 151 may be provided on a bottom surface of the first interconnection layer 120. The first bonding chip pads 152 and the first conductive chip pads 151 may be electrically connected to the first interconnection structures 123. The first bonding chip pads 152 may be provided on the bottom surface of the center region of the first interconnection layer 120. The first bonding chip pads 152 may be formed of, or may include, a metallic material (e.g., copper). The first conductive chip pads 151 may be provided on the bottom surface of the edge region of the first interconnection layer 120. The first conductive chip pads 151 may be laterally spaced apart from and electrically disconnected or isolated from the first bonding chip pads 152. The first conductive chip pads 151 may be formed of, or may include, at least one metallic material (e.g., aluminum, nickel, and/or copper).

The first alignment key pattern 170 may be provided on the bottom surface of the edge region of the first interconnection layer 120. A bottom surface of the first alignment key pattern 170 may be exposed by the first interconnection layer 120, but the inventive concepts are not limited thereto. The first alignment key pattern 170 may be laterally spaced apart from and electrically disconnected or isolated from the first bonding chip pads 152 and the first conductive chip pads 151. The first alignment key pattern 170 may be formed of or include a metallic material (e.g., copper). In some embodiments, the first alignment key pattern 170 may be a metal dummy pattern. The first alignment key pattern 170 may be formed of, or may include, the same metallic material as the first bonding chip pads 152 or the first conductive chip pads 151, but the inventive concepts are not limited thereto.

Hereinafter, the first integrated circuit 115, the first interconnection layer 120, and the first alignment key pattern 170 will be described in more detail with reference to FIG. 1C.

As shown in FIG. 1C, the first integrated circuit 115 may be on the bottom surface of the first semiconductor substrate 110. The first integrated circuit 115 may include a transistor. In some embodiments, a plurality of the first integrated circuits 115 may be provided, differing from the illustration of FIG. 1C. Herein, an element that is described as "electrically connected to a semiconductor chip" may mean that the element is electrically connected to integrated circuits through chip pads of the semiconductor chip. Herein, when elements are described as "electrically connected to each other," the elements may be directly connected to each other, or indirectly connected to each other through another element and in electrical communication.

The first interconnection layer 120 may include one or more of first dielectric layers 121 and one or more first interconnection structures 123. The first dielectric layers 121 may be stacked on the bottom surface of the first semiconductor substrate 110. The first dielectric layers 121 may be formed of or include at least one of silicon-based insulating materials (e.g., silicon oxide, silicon nitride, and/or silicon oxynitride). The first interconnection structures 123 may be electrically connected to the first integrated circuits 115. Each of the first interconnection structures 123 may include first interconnection lines and first vias. The first interconnection lines may be interposed between the first dielectric layers 121. The first vias may penetrate the first dielectric layers 121. The first interconnection layer 120 may include a front-end-of-line (FEOL) layer and a back-end-of-line (BEOL) layer. The FEOL layer of the first interconnection layer 120 may be provided between the first semiconductor substrate 110 and the BEOL layer of the first interconnection layer 120.

The first alignment key pattern 170 may be provided on a bottom surface of the lowermost one of the first dielectric layers 121. The first alignment key pattern 170 may be a dummy pattern. The first alignment key pattern 170 may not be electrically connected to any other conductive element. For example, the first alignment key pattern 170 may be spaced apart from the first interconnection structures 123. The first alignment key pattern 170 may be electrically disconnected or isolated from the first interconnection structures 123 and the first integrated circuit 115.

Referring back to FIG. 1B, the conductive structures 550 may be between the redistribution substrate 300 and the first semiconductor chip 100. The conductive structures 550 may be laterally spaced apart from the second semiconductor chip 200. Furthermore, the conductive structures 550 may be laterally spaced apart from each other. The conductive structures 550 may be provided on and coupled to the fourth conductive patterns 350. The conductive structures 550 may be provided on the bottom surface of the edge region of the first interconnection layer 120 and may be coupled to the first conductive chip pads 151, respectively. Accordingly, the first semiconductor chip 100 may be coupled to the redistribution substrate 300 through the conductive structures 550.

Each of the conductive structures 550 may include a conductive pillar. In some embodiments, and differing from the drawings, each of the conductive structures 550 may include a plurality of stacked conductive pillars. The conductive structures 550 may be formed of or include a metallic material (e.g., copper).

The second semiconductor chip 200 may be provided between the top surface of the redistribution substrate 300 and a bottom surface of the first semiconductor chip 100. The second semiconductor chip 200 may be a logic chip. A width of the second semiconductor chip 200 may be smaller than a width of the redistribution substrate 300 and a width of the first semiconductor chip 100. Herein, unless indicated otherwise, a width and a length of the second semiconductor chip 200 may refer to a width and a length of a second interconnection layer 220 of the second semiconductor chip 200. The length of the second semiconductor chip 200 may be smaller than a length of the redistribution substrate 300 and a length of the first semiconductor chip 100. Accordingly, the second semiconductor chip 200 may expose the bottom surface of the edge region of the first interconnection layer 120. The second semiconductor chip 200 may be spaced apart from the edge region of the first interconnection layer 120, when viewed in a plan view. Accordingly, the second semiconductor chip 200 may be spaced apart from the first alignment key pattern 170 and the first conductive chip pads 151. The dimensions of the second semiconductor chip 200 may expose the first alignment key pattern 170 and the first conductive chip pads 151.

The second semiconductor chip 200 may include a second semiconductor substrate 210, penetration vias 260, the second interconnection layer 220, a second integrated circuit 215, second chip pads 250, and a second alignment key pattern 270. The second interconnection layer 220 may be provided on the bottom surface of the center region of the first interconnection layer 120. The second interconnection layer 220 may be provided to face the first interconnection layer 120. The second interconnection layer 220 may be provided to expose the bottom surface of the edge region of the first interconnection layer 120.

The second interconnection layer 220 may have a center region and an edge region, when viewed in a plan view. The edge region of the second interconnection layer 220 may be provided to enclose the center region, when viewed in the plan view. The edge region of the second interconnection layer 220 may be provided between side surfaces of the second interconnection layer 220 and the center region of the second interconnection layer 220. The second interconnection layer 220 may include a second dielectric layer 221 and second interconnection structures 223.

The second semiconductor substrate 210 may be provided on a bottom surface of the center region of the second interconnection layer 220. The second semiconductor substrate 210 may be spaced apart from a bottom surface of the edge region of the second interconnection layer 220 to expose the bottom surface of the edge region of the second interconnection layer 220. A width of the exposed edge region of the second interconnection layer 220 in the third direction D3 may range from 10 μm to 30 μm. The second semiconductor substrate 210 may be a crystalline substrate that is formed of silicon, germanium, or silicon germanium, as examples.

The penetration vias 260 may be provided in the second semiconductor substrate 210. The penetration vias 260 may penetrate the second semiconductor substrate 210 from top to bottom. Bottom surfaces of the penetration vias 260 may be provided at a level that is equal to or lower than the bottom surface of the second semiconductor substrate 210. Herein, a level of an element may refer a vertical level of the element measured in the fourth direction D4. Additionally, if elements are described herein to have the same width, height, and/or level, the elements may be formed such that widths, heights, and/or levels thereof are within a specific process tolerance. The bottom surfaces of the penetration vias 260 may be coupled to the third conductive patterns 340. Accordingly, the penetration vias 260 may be electrically connected to the solder balls 500 through the redistribution substrate 300. The penetration vias 260 may be further extended into a lower portion of the second interconnection layer 220, but the inventive concepts are not limited thereto. The penetration vias 260 may be electrically connected to the second interconnection structures 223. The penetration vias 260 may be formed of or include at least one metallic material (e.g., copper or tungsten).

Hereinafter, the second interconnection layer 220, the second chip pads 250, the second integrated circuit 215, and the second alignment key pattern 270 will be described in greater detail with reference to FIGS. 1B and 1D.

The second integrated circuit 215 may be provided on the top surface of the second semiconductor substrate 210. The second integrated circuit 215 may include transistors. In some embodiments, a plurality of the second integrated circuits 215 may be provided, differing from that illustrated in the drawings. The second interconnection layer 220 may be provided on the top surface of the second semiconductor substrate 210. The second interconnection layer 220 may include a plurality of stacked second dielectric layers 221. The second dielectric layers 221 may be formed of or include at least one of silicon-based insulating materials (e.g., silicon oxide, silicon nitride, and/or silicon oxynitride). The second interconnection structures 223 may be electrically connected to the second integrated circuits 215. Accordingly, the penetration vias 260 may be electrically connected to the second integrated circuits 215 through the second interconnection structures 223. The second interconnection structure 223 may include second interconnection lines and second vias. The second interconnection lines may be interposed between the second dielectric layers 221. The second vias may penetrate the second dielectric layers 221.

The second interconnection layer 220 may include an FEOL layer and a BEOL layer. The FEOL layer of the second interconnection layer 220 may be provided between the BEOL layer of the second interconnection layer 220 and the second semiconductor substrate 210.

The second chip pads 250 may be on a top surface of the second interconnection layer 220. For example, the second chip pads 250 may be provided in the uppermost one of the second dielectric layers 221. Top surfaces of the second chip pads 250 may be exposed by the uppermost one of the second dielectric layers 221. The second chip pads 250 may be formed of or include at least one metallic material (e.g., copper). The second chip pads 250 may be connected to the first bonding chip pads 152 by a direct bonding method. For example, the second chip pads 250 may be in direct contact with the first bonding chip pads 152. In some embodiments, there may be no observable interface between the second chip pads 250 and the first bonding chip pads 152. The uppermost one of the second dielectric layers 221 and the lowermost one of the first dielectric layers 121 may be in direct contact with each other. The uppermost one of the second dielectric layers 221 and the lowermost one of the first dielectric layers 121 may be bonded to each other by chemical bonds therebetween. The chemical bonds may include covalent bonds. In some embodiments, there may be no observable interface between the uppermost one of the second dielectric layers 221 and the lowermost one of the first dielectric layers 121. Herein, the direct bonding between the first and second interconnection layers 120 and 220 may include a direct bonding between the uppermost one of the second dielectric layers 221 and the lowermost one of the first dielectric layers 121. Accordingly, the second semiconductor chip 200 may be connected to the first semiconductor chip 100 by such a direct bonding. Herein, when two chips are described as being connected to each other by a direct bonding method or in a direct bonding manner, this may include that chip pads or insulating elements, which are respectively included in the two chips and are paired to face each other, are directly bonded to each other. When insulating elements are described as being directly bonded to each other, chemical bonds may be formed between the insulating elements. The insulating elements may include the uppermost one of the second dielectric layers 221 and the lowermost one of the first dielectric layers 121.

Since the first bonding chip pads 152 may be directly bonded to the second chip pads 250, the first semiconductor chip 100 may be electrically connected to the second integrated circuits 215 and the penetration vias 260 through the second interconnection structures 223.

The second alignment key pattern 270 may be provided on the bottom surface of the edge region of the second interconnection layer 220. The second alignment key pattern 270 may be exposed by the second semiconductor substrate 210. For example, the second alignment key pattern 270 may be provided in the lowermost one of the first dielectric layers 121. The lowermost one of the first dielectric layers 121 may be provided to expose a bottom surface of the second alignment key pattern 270. The second alignment key pattern 270 may be a dummy metal pattern. For example, the second alignment key pattern 270 may be spaced apart from the second interconnection structures 223. The second alignment key pattern 270 may be electrically disconnected or isolated from the second interconnection structures 223, the penetration vias 260, the second chip pads 250, and the second integrated circuits 215. The second alignment key pattern 270 may be formed of or include at least one metallic material (e.g., copper, aluminum, or nickel).

As shown in FIG. 1B, the insulating sealing layer 400 may be provided between the top surface of the redistribution substrate 300 and the bottom surface of the first semiconductor chip 100. An outer side surface of the insulating sealing layer 400 may be vertically aligned to a side surface of the redistribution substrate 300 and a side surface of the first semiconductor chip 100. The insulating sealing layer 400 may cover or vertically overlap the first and second alignment key patterns 170 and 270. The insulating sealing layer 400 may cover side surfaces of the conductive structures 550, a side surface of the second interconnection layer 220, the bottom surface of the edge region of the second interconnection layer 220, and a side surface of the second semiconductor substrate 210. In some embodiments, the insulating sealing layer 400 may be extended into a region between the redistribution substrate 300 and the bottom surface of the second semiconductor substrate 210 to further cover lower side surfaces of the penetration vias 260. The insulating sealing layer 400 may be formed of or include a material different from the organic insulating layer 301. The insulating sealing layer 400 may be formed of or include a silicon-based insulating material (e.g., silicon oxide).

Hereinafter, relative positions and shapes of the first and second alignment key patterns 170 and 270 and the edge region of the first interconnection layer 120 will be described in more detail with reference to FIG. 1A.

The first interconnection layer 120 may be provided on the first semiconductor substrate 110. The first interconnection layer 120 may have substantially the same size as the first semiconductor substrate 110.

The second interconnection layer 220 may be on the first interconnection layer 120. The edge region of the first interconnection layer 120 may be exposed by the second interconnection layer 220. The first alignment key pattern 170 may be provided on the exposed edge region of the second interconnection layer 220. In some embodiments, a plurality of the first alignment key patterns 170 may be provided. In some embodiments, when viewed in a plan view, each of the first alignment key patterns 170 may have a shape of letter "L" or one of shapes obtained by rotating the letter "L". Each of the first alignment key patterns 170 may have a first width W1 on the first direction D1. The first width W1 may be larger than or equal to about 5 μm. Each of the first alignment key patterns 170 may have a first length in the second direction D2. The first length may be larger than or equal to about 5 μm. If the first width W1 and the first length are smaller than 5 μm, it may be difficult to recognize the first alignment key patterns 170. According to some embodiments of the inventive concepts, since each of the first width W1 and the first length is larger than or equal to 5 μm, the first alignment key patterns 170 may be recognized in a more accurate manner.

The second semiconductor substrate 210 may be on the second interconnection layer 220. The second semiconductor substrate 210 may be placed to expose the edge region of the second interconnection layer 220. A width W10 of the exposed edge region of the second interconnection layer 220 in the first direction D1 may range from 10 μm to 30 μm. A width W11 of the edge region of the second interconnection layer 220 in the third direction D3 may be equal to or smaller than the width W10 of the edge region of the second interconnection layer 220 in the first direction D1. The width W11 of the edge region of the second interconnection layer 220 in the third direction D3 may range from 10 μm to 30 μm. If the widths W10 and W11 are larger than 30 μm, an area allowed for the second integrated circuits 215 (e.g., of FIG. 1D) may be excessively restricted. If the widths W10 and W11 are smaller than 10 μm, a warpage issue may occur in the first semiconductor chip 100 or the second semiconductor chip 200. According to some embodiments of the inventive concepts, since the widths W10 and W11 range from 10 μm to 30 μm, the second integrated circuits 215 may be designed in a freer manner, and the first and second semiconductor chips 100 and 200 may be free or freer from the warpage issue.

The second alignment key pattern 270 may be provided on the edge region of the second interconnection layer 220. The second alignment key pattern 270 may have a second width W2 in the first direction D1. The second width W2 may range from 5 μm to 15 μm. The second width W2 may be smaller than the width W10 of the edge region of the second interconnection layer 220 in the first direction D1. The second alignment key pattern 270 may have a second length in the second direction D2. The second length may range from 5 μm to 15 μm. Since the second width W2 and the second length are larger than 5 μm, the second alignment key patterns 270 may be recognized in a more accurate manner. If the second width W2 or the second length is smaller than 15 μm, a restriction may be imposed on an arrangement of the second integrated circuits 215 or the penetration vias 260 described with reference to FIG. 1D. By contrast, according to some embodiments of the inventive concepts, since the second width W2 and the second length are larger than 15 μm, positions of the second integrated circuits 215 or the penetration vias 260 described with reference to FIG. 1D may be designed in a freer manner.

The second interconnection layer 220 may have corners 220Z, which are defined by side surfaces thereof. The second alignment key patterns 270 may be adjacent to the corners 220Z. When viewed in a plan view, each of the second alignment key patterns 270 may have a shape of letter "L" or one of shapes obtained by rotating the letter "L".

The first alignment key patterns 170 may be adjacent to and outside the corners 220Z of the second interconnection layer 220, when viewed in a plan view. Accordingly, at least one of pairs of the first and second alignment key patterns 170 and 270 may be included together in a single image obtained by an inspection process, and this may facilitate the inspection process on the first and second alignment key patterns 170 and 270.

Figure 2:
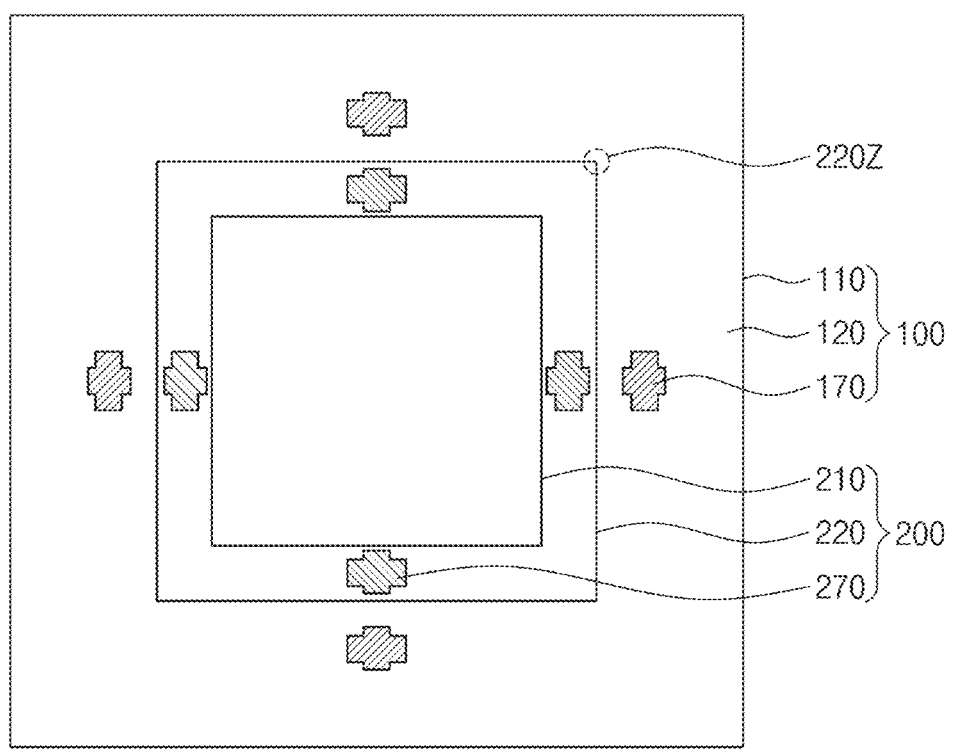
FIG. 2 is a diagram illustrating a first alignment key pattern and a second alignment key pattern.
Figure 2:
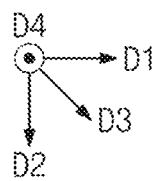

FIG. 2 is a diagram illustrating a first alignment key pattern and a second alignment key pattern. For concise description, a previously described element may be identified by the same reference number without repeating an overlapping description thereof.

Referring to FIG. 2, the first semiconductor chip 100 may include the first semiconductor substrate 110, the first interconnection layer 120, and the first alignment key patterns 170. The first alignment key patterns 170 may be provided on the edge region of the first interconnection layer 120.

The second semiconductor chip 200 may include the second semiconductor substrate 210, the second interconnection layer 220, and the second alignment key patterns 270. The second semiconductor substrate 210 may be placed to expose the edge region of the second interconnection layer 220. The second alignment key patterns 270 may be provided on the edge region of the second interconnection layer 220.

Each of the first alignment key patterns 170 and each of the second alignment key patterns 270 may have a cross shape, when viewed in a plan view. However, the planar shapes of the first and second alignment key patterns 170 and 270 may be variously changed. For example, at least one of the first and second alignment key patterns 170 and 270 may have a polygonal or circular shape. The planar shape of the second alignment key pattern 270 may be the same as or different from that of the first alignment key pattern 170.

The first and second alignment key patterns 170 and 270 may not be adjacent to the corners 220Z of the second interconnection layer 220. In some embodiments, the first and second alignment key patterns 170 and 270 may be adjacent to the corners 220Z of the second interconnection layer 220, as described with reference to FIG. 1A, with the understanding that the present disclosure is not limited to. Hereinafter, for brevity's sake, the description that follows will refer to an example which includes one first alignment key pattern 170 and one second alignment key pattern 270, but the inventive concepts are not limited thereto.

Figure 3A:
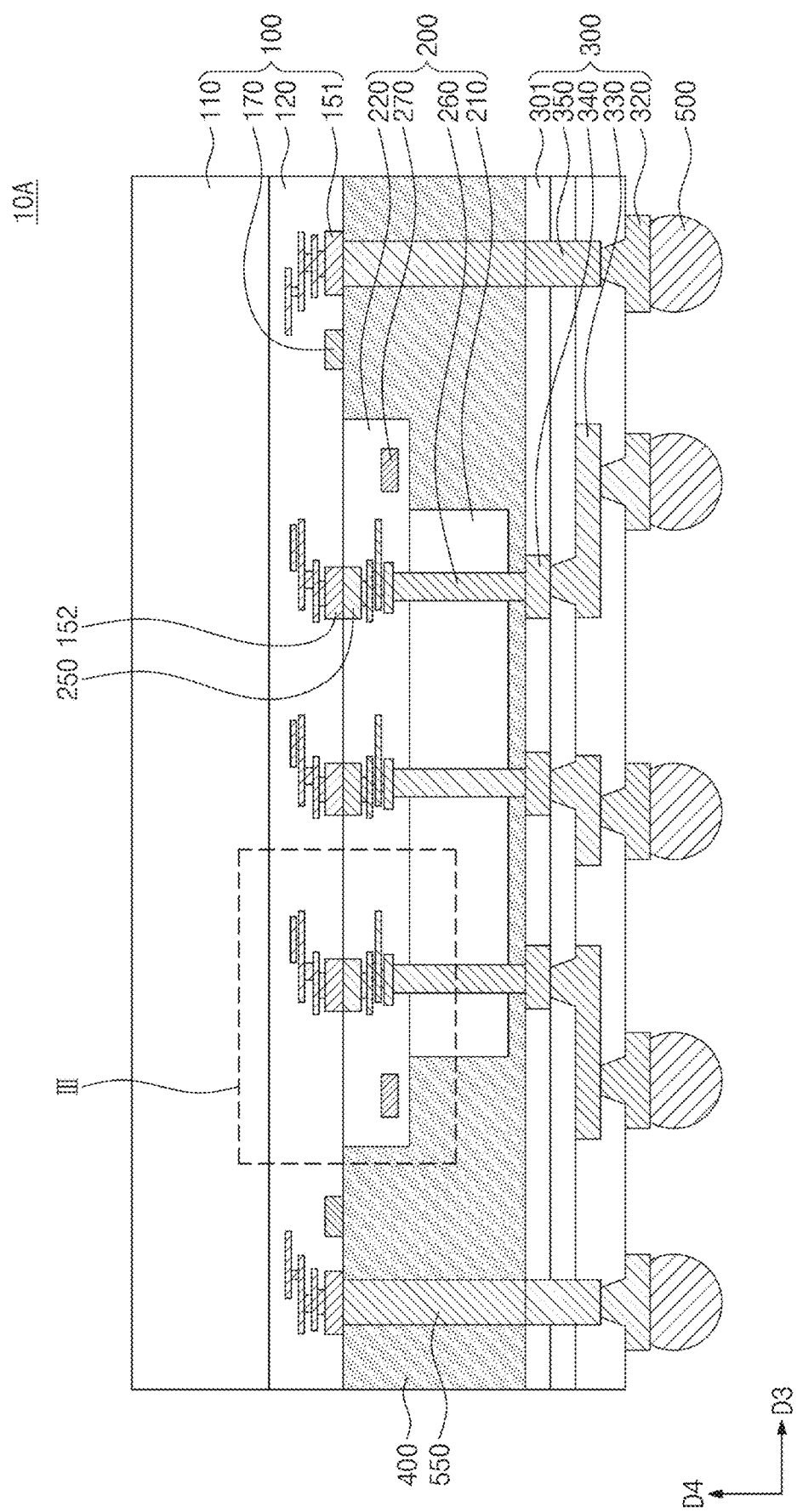
FIG. 3A is a sectional view illustrating a semiconductor package according to some embodiments of the present inventive concepts.
Figure 3B:
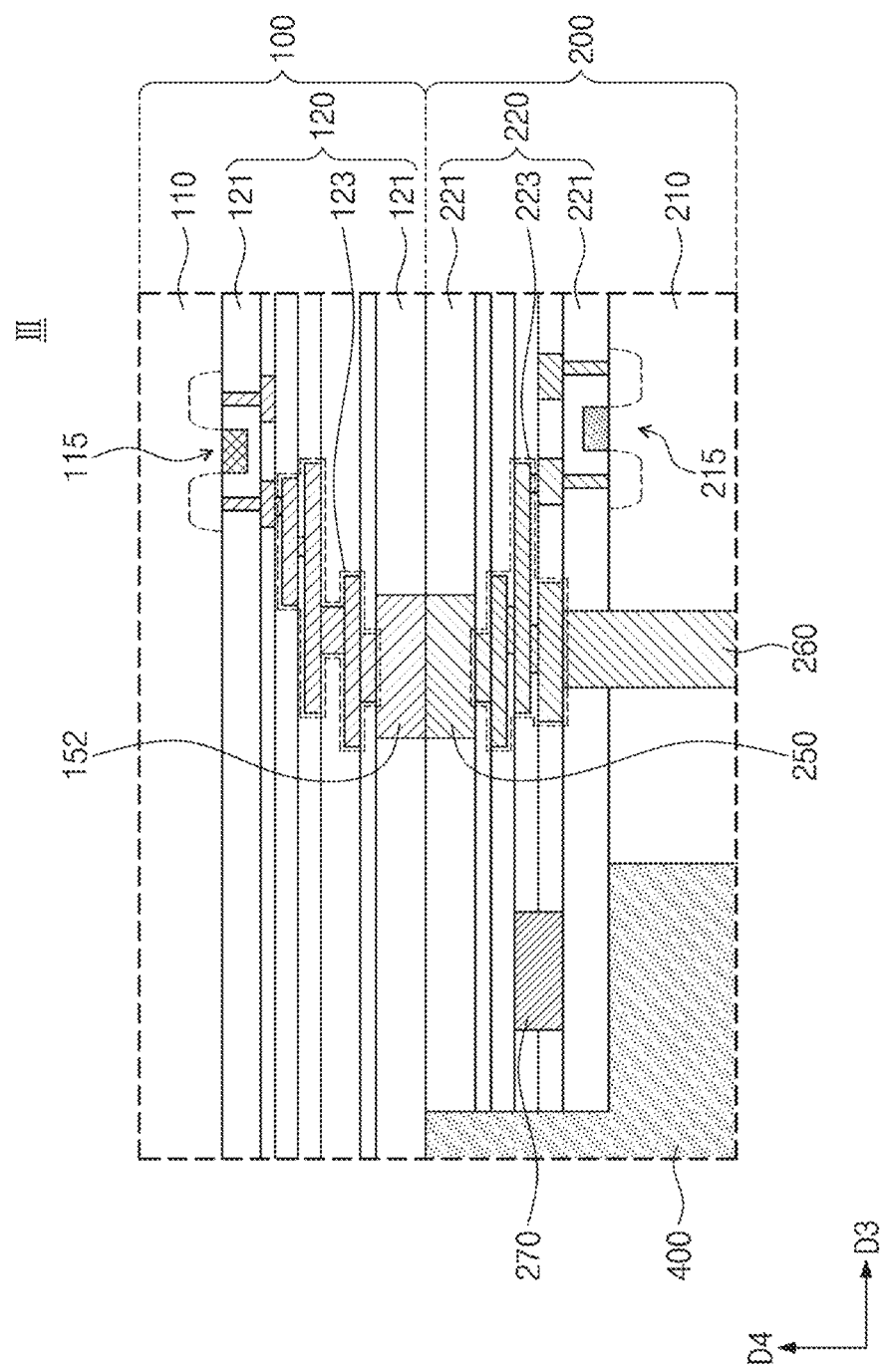
FIG. 3B is an enlarged sectional view illustrating a portion 'III' of FIG. 3A.

FIG. 3A is a sectional view, which is taken along the line I-I' of FIG. 1A to illustrate a semiconductor package according to some embodiments of the inventive concepts. FIG. 3B is an enlarged sectional view illustrating a portion 'III' of FIG. 3A.

Referring to FIGS. 3A and 3B, a semiconductor package 10A may include the redistribution substrate 300, the solder balls 500, the first semiconductor chip 100, the second semiconductor chip 200, the conductive structures 550, and the insulating sealing layer 400. The redistribution substrate 300, the solder balls 500, the first semiconductor chip 100, the second semiconductor chip 200, the conductive structures 550, and the insulating sealing layer 400 may be substantially the same as those described with reference to FIGS. 1A to 1D. For example, the second semiconductor chip 200 may include the second semiconductor substrate 210, the second interconnection layer 220, the second chip pads 250, the penetration vias 260, and the second alignment key pattern 270. The second alignment key pattern 270 may be provided on the edge region of the second interconnection layer 220, when viewed in a plan view. However, the second alignment key pattern 270 may not be exposed to the outside of the second interconnection layer 220. As seen in FIG. 3B, the lowermost one of the second dielectric layers 221 may be further provided on the bottom surface of the second alignment key pattern 270. The lowermost one of the second dielectric layers 221 may be a layer that is included in the interconnection layer of the FEOL layer of the second interconnection layer 220. Any conductive element may not be provided between the second alignment key pattern 270 and a bottom surface of the second interconnection layer 220.

The second dielectric layers 221 may be substantially transparent to light. For example, light may pass through the lowermost one of the second dielectric layers 221 and may be incident into the second alignment key pattern 270. The second alignment key pattern 270 may be configured to reflect the light. The presence of the second alignment key pattern 270 may be recognized by measuring the reflected light. This process may be used to obtain information on the position of the second semiconductor chip 200.

Figure 4:
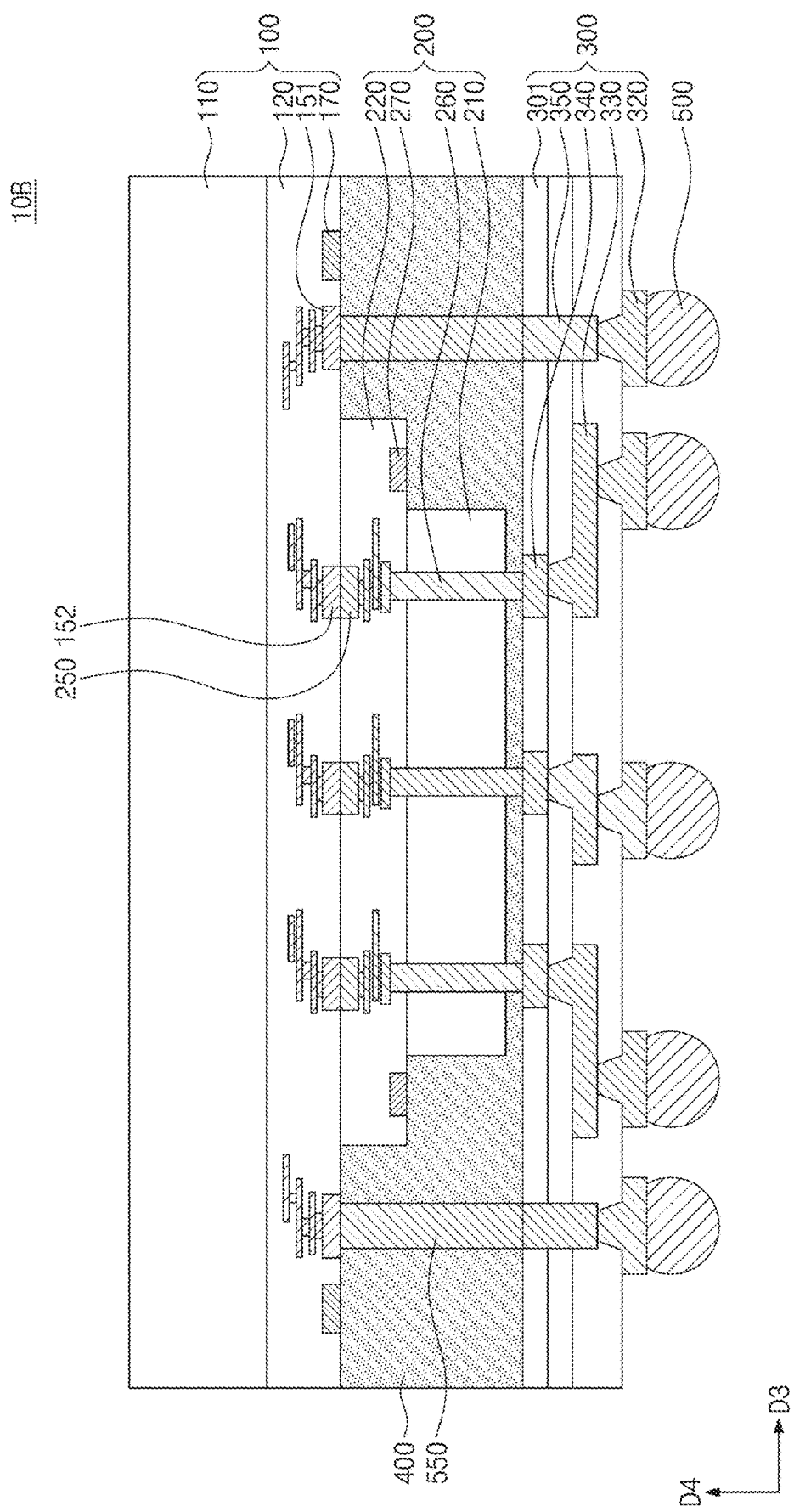
FIG. 4 is a sectional view illustrating a semiconductor package according to some embodiments of the inventive concepts.

FIG. 4 is a sectional view, which is taken along the line I-I' of FIG. 1A to illustrate a semiconductor package according to some embodiments of the inventive concepts.

Referring to FIG. 4, a semiconductor package 10B may include the redistribution substrate 300, the solder balls 500, the first semiconductor chip 100, the second semiconductor chip 200, the conductive structures 550, and the insulating sealing layer 400. The first bonding chip pads 152, the first conductive chip pads 151, and the first alignment key pattern 170 may be provided on the bottom surface of the first semiconductor chip 100. The first conductive chip pads 151 may be between the first alignment key pattern 170 and the first bonding chip pads 152. For example, when viewed in a plan view, a distance between the side surface of the first semiconductor chip 100 and the first alignment key pattern 170 may be smaller than a distance between the side surface of the first semiconductor chip 100 and the first conductive chip pads 151.

The planar arrangement of the first conductive chip pads 151 and the first alignment key pattern 170 may be variously changed. For example, in contrast to what is illustrated in the drawings, the first conductive chip pads 151 may be in a localized region near the second semiconductor chip 200. When viewed in a plan view, the first alignment key pattern 170 may be provided between the first conductive chip pads 151.

FIGS. 5A, 5B, 5E, 5F, 5G, and 5H are sectional views illustrating a method of fabricating a semiconductor package, according to some embodiments of the inventive concepts. FIG. 5C is an enlarged sectional view of a portion 'IV' of FIG. 5B, which is provided to illustrate in greater detail a process of recognizing the first and second alignment key patterns 170 and 270 according to some embodiments of the inventive concepts. FIG. 5D is an enlarged sectional view of a portion 'IV' of FIG. 5B, which is provided to illustrate a process of recognizing the first and second alignment key patterns 170 and 270 according to some embodiments of the inventive concepts. Hereinafter, for brevity's sake, each of the first and second dielectric layers will be described as a single layer. In the following description of FIGS. 5A to 5H, relative vertical positions (e.g., top and bottom surfaces) of an element will be given based on a referenced figure.

Referring to FIG. 5A, a semiconductor wafer 100W may be prepared. The semiconductor wafer 100W may include a plurality of the first semiconductor chips 100. The first semiconductor chips 100 may be arranged laterally and may be connected to each other. The first semiconductor chips 100 may be defined by a scribe lane (not shown) provided on a surface of the semiconductor wafer 100W, but the inventive concepts are not limited thereto.

The formation of the semiconductor wafer 100W may include preparing the first semiconductor substrate 110 in a wafer level, forming the penetration vias 260, forming the first interconnection layer 120 including the first dielectric layer 121 and the first interconnection structures 123, forming the first alignment key pattern 170, and forming the first bonding chip pads 152 and the first conductive chip pads 151.

The semiconductor wafer 100W may be provided on a temporary substrate 900. For example, the first semiconductor substrate 110 may be attached to the temporary substrate 900. Here, an adhesive layer (not shown) may be further provided between the first semiconductor substrate 110 and the temporary substrate 900. The temporary substrate 900 may be a carrier substrate.

The second semiconductor chips 200 may be prepared. Each of the second semiconductor chips 200 may include the second semiconductor substrate 210, the second interconnection layer 220, the second chip pads 250, the penetration vias 260, and the second alignment key pattern 270, as described with reference to the embodiments of FIGS. 1B and 1D. The second alignment key pattern 270 may be provided on the top surface of the second interconnection layer 220. However, the second semiconductor chip 200 may have substantially the same width as the second interconnection layer 220. The second semiconductor substrate 210 may be provided on a top surface of the second alignment key pattern 270 and the top surface of the second interconnection layer 220. Top surfaces of the penetration vias 260 may be placed in the second semiconductor substrate 210.

The second semiconductor chips 200 may be provided on the semiconductor wafer 100W to be laterally spaced apart from each other. The second semiconductor chips 200 may be vertically overlapped with the first semiconductor chips 100. Here, the second interconnection layer 220 may be provided to face a corresponding one of the first interconnection layers 120. Each of the second semiconductor chips 200 may not be provided on an edge region of a corresponding one of the first semiconductor chips 100. Stated differently, each of the second semiconductor chips 200 may be spaced apart from the edge portion of the corresponding one of the first semiconductor chips 100. The second semiconductor chips 200 may be spaced apart from the first alignment key pattern 170 and the first conductive chip pads 151.

A bonding process may be performed on the second semiconductor chips 200 and the semiconductor wafer 100W. In some embodiments, the bonding process may include applying heat or pressure to the second semiconductor chips 200 and the semiconductor wafer 100W. Accordingly, the second semiconductor chips 200 may be connected to the first semiconductor chips 100 in a direct bonding manner. For example, the second chip pads 250 of the second semiconductor chips 200 may be directly bonded to the first bonding chip pads 152 of the first semiconductor chips 100. Owing to the heat or pressure, metal atoms of the second chip pads 250 may be diffused into the first bonding chip pads 152, and metal atoms of the first bonding chip pads 152 may be diffused into the second chip pads 250. Accordingly, there may be no observable interface between the second chip pads 250 and the first bonding chip pads 152, but the inventive concepts are not limited thereto.

As a result of the bonding process, the second interconnection layer 220 may be directly bonded to a corresponding one of the first interconnection layers 120. For example, the second dielectric layer 221 of the second interconnection layer 220 may be directly bonded to the first dielectric layer 121 of the first interconnection layer 120. Chemical bonds may be formed between the second dielectric layer 221 of the second interconnection layer 220 and the first dielectric layer 121 of the first interconnection layer 120.

Figure 5B:
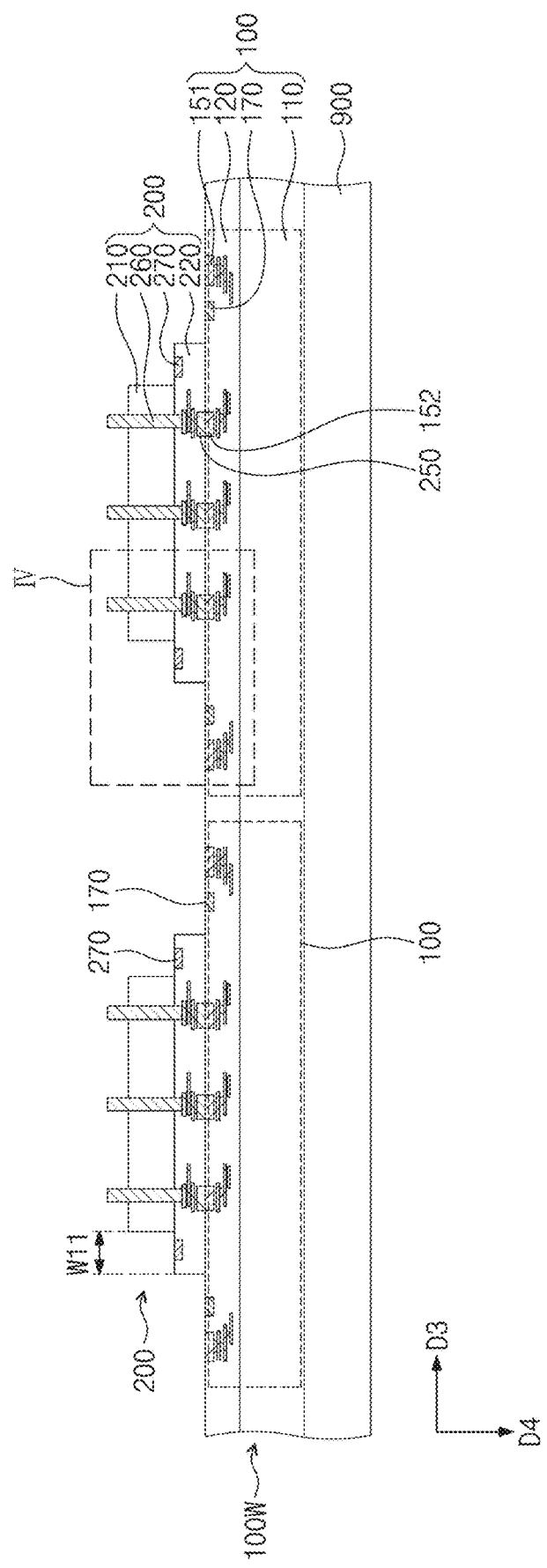
Figure 5C:
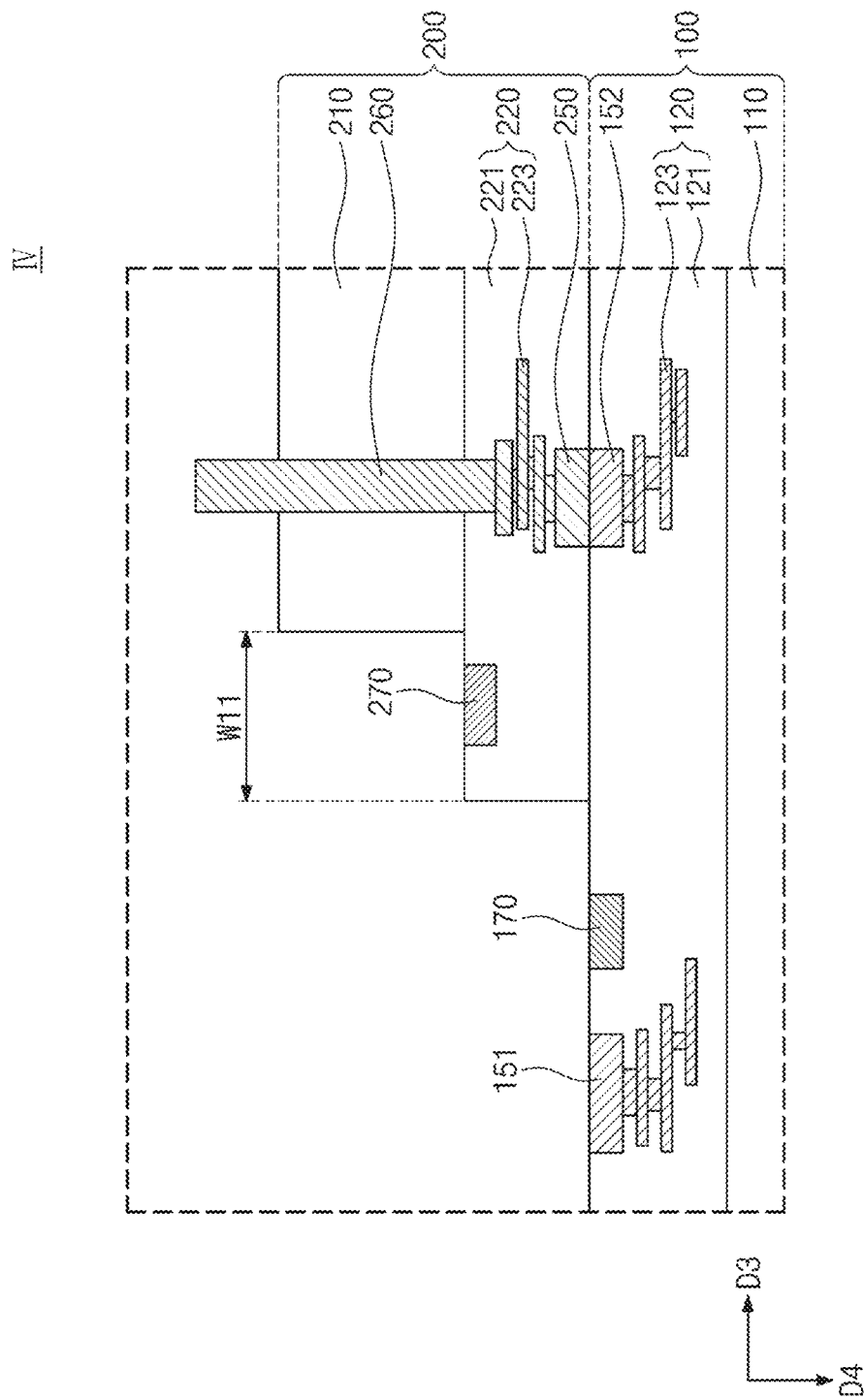
FIG. 5C is an enlarged sectional view illustrating a portion 'IV' of FIG. 5B.
Figure 5D:
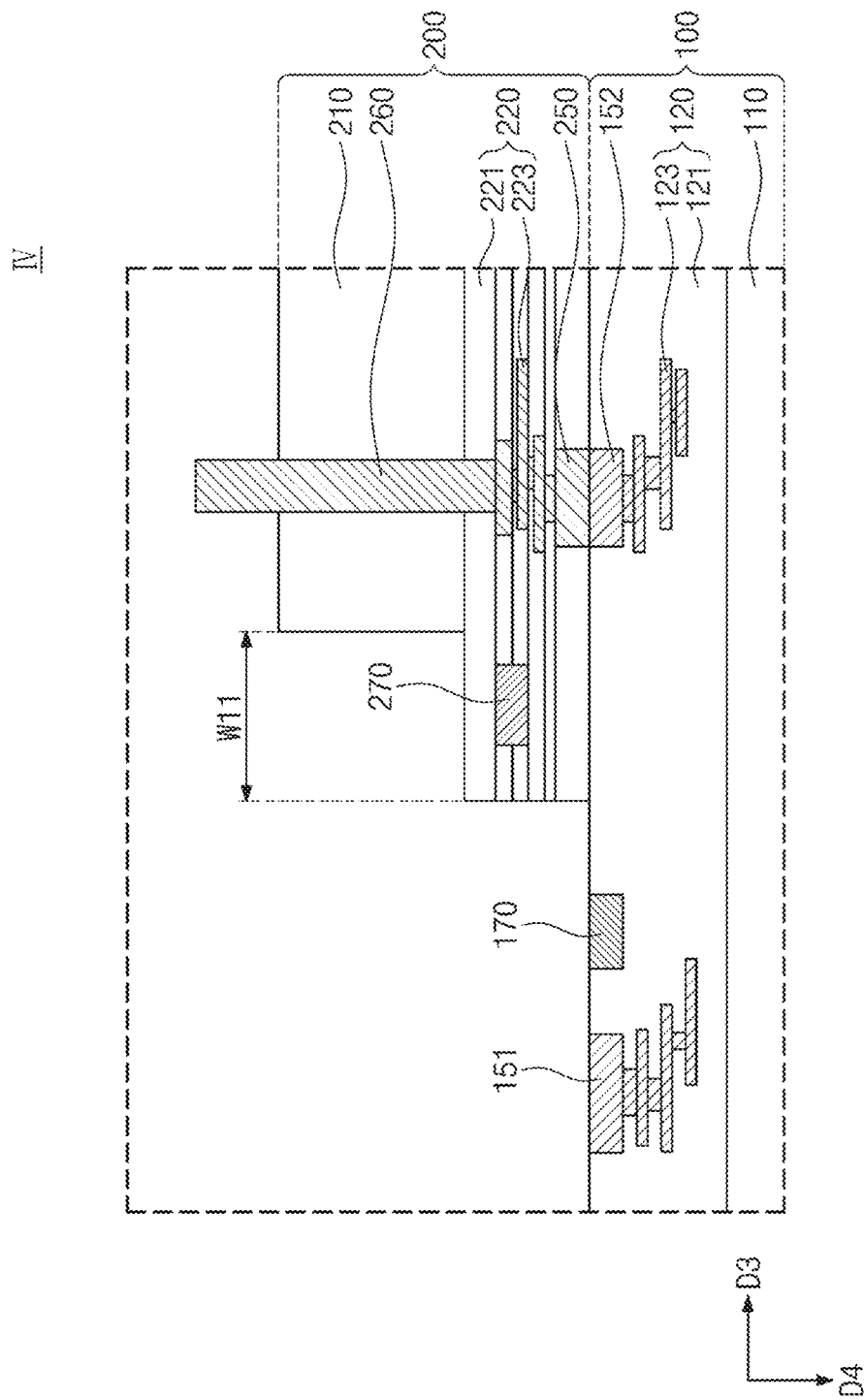
FIG. 5D is a sectional view illustrating a method of recognizing a first alignment key pattern and a second alignment key pattern, according to some embodiments of the inventive concepts.
Figure 5E:
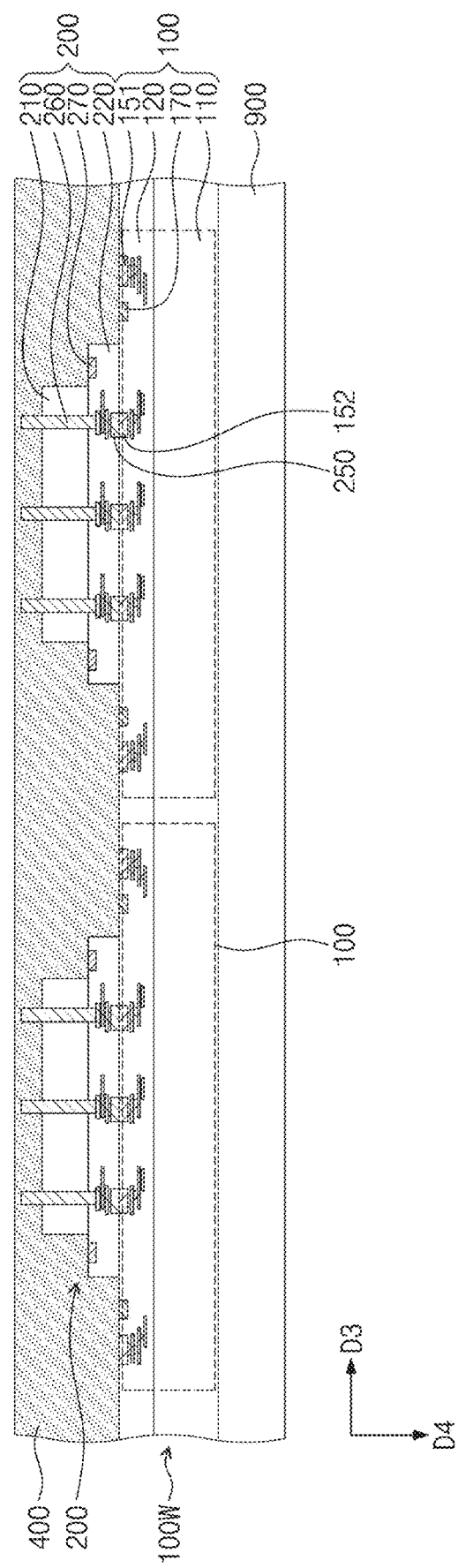

Referring to FIGS. 5B and 5C, an etching process may be performed on the second semiconductor chip 200. The etching process may be a dry etching process using etching gas. The first interconnection layer 120, the second interconnection layer 220, and the penetration vias 260 may have an etch selectivity with respect to the second semiconductor substrate 210. The etching process may be an isotropic etching process. Accordingly, upper and side portions of the second semiconductor substrate 210 may be removed by the isotropic etching process. As a result of the etching process, end portions of the penetration vias 260 may be exposed to the outside of the second semiconductor substrate 210 near a recessed top surface of the second semiconductor substrate 210.

Since the side portions of the second semiconductor substrate 210 are removed, the edge region of the second interconnection layer 220 may be exposed to the outside. Accordingly, the second alignment key pattern 270 may be exposed to the outside. The first alignment key pattern 170 may be on a top surface of the first interconnection layer 120. The first and second alignment key patterns 170 and 270 may be disposed to be adjacent to each other, as described with reference to FIG. 1A.

An inspection process may be performed to determine positions of the first and second alignment key patterns 170 and 270. The inspection process may be performed using light. A position of each of the first and second semiconductor chips 100 and 200 may be calculated from position data of the first and second alignment key patterns 170 and 270 obtained by the inspection process. Accordingly, it may be possible to evaluate whether the first and second semiconductor chips 100 and 200 are placed at desired positions.

A process of etching the second semiconductor substrate 210 and a process of recognizing the first and second alignment key patterns 170 and 270, according to some embodiments of the inventive concepts, will be described below.

Referring to FIG. 5D in conjunction with FIG. 5B, an etching process may be performed on the second semiconductor chip 200. The etching process may be performed by the same method as that described with reference to FIGS. 5B and 5C. The etching process may be an isotropic etching process. Upper and side portions of the second semiconductor substrate 210 may be removed by the isotropic etching process, and in this case, end portions of the penetration vias 260 and the edge region of the second interconnection layer 220 may be exposed to the outside.

The second dielectric layer 221 may include a plurality of stacked layers. However, at least one second dielectric layer 221 may be further provided on the second alignment key pattern 270. The etching process may be performed using an etch recipe having an etch selectivity with respect to the second dielectric layer 221. For example, the etching process may be performed such that at least one of the second dielectric layers 221 is left on the top surface of the second alignment key pattern 270 after the etching process. The second alignment key pattern 270 may not be exposed to the outside. Furthermore, any metal-containing element may not be provided on the top surface of the second alignment key pattern 270.

Information on positions of the first and second alignment key patterns 170 and 270 may be obtained by inspecting the first and second alignment key patterns 170 and 270 using light. For example, light capable of passing through the second dielectric layer 221 may be irradiated onto the second alignment key pattern 270. The first and second alignment key patterns 170 and 270 may be configured to reflect the light. The information on positions of the first and second alignment key patterns 170 and 270 may be obtained by detecting the reflected light. A position of each of the first and second semiconductor chips 100 and 200 may be calculated from the position information.

The number of the second dielectric layers 221, which are provided on the top surface of the second alignment key pattern 270, may be variously changed. For example, a plurality of the second dielectric layers 221 may be provided on the top surface of the second alignment key pattern 270.

Referring back to FIGS. 5B and 5E, the insulating sealing layer 400 may be further formed on the semiconductor wafer 100W and the second semiconductor chips 200. The insulating sealing layer 400 may be formed by a deposition process. The deposition process may be a chemical vapor deposition (CVD) process, but the inventive concepts are not limited thereto.

The insulating sealing layer 400 may cover the top surface of the first semiconductor chip 100, the side surfaces of the second semiconductor chip 200, and the top surface of the second semiconductor chip 200. For example, the insulating sealing layer 400 may be formed to cover the edge region of the first interconnection layer 120, the first alignment key pattern 170, the first conductive chip pads 151, the edge region of the second interconnection layer 220, the second alignment key pattern 270, the second semiconductor substrate 210, and the end portions of the penetration vias 260. A top surface of the insulating sealing layer 400 may be located at a level higher than the top surfaces of the penetration vias 260.

Figure 5F:
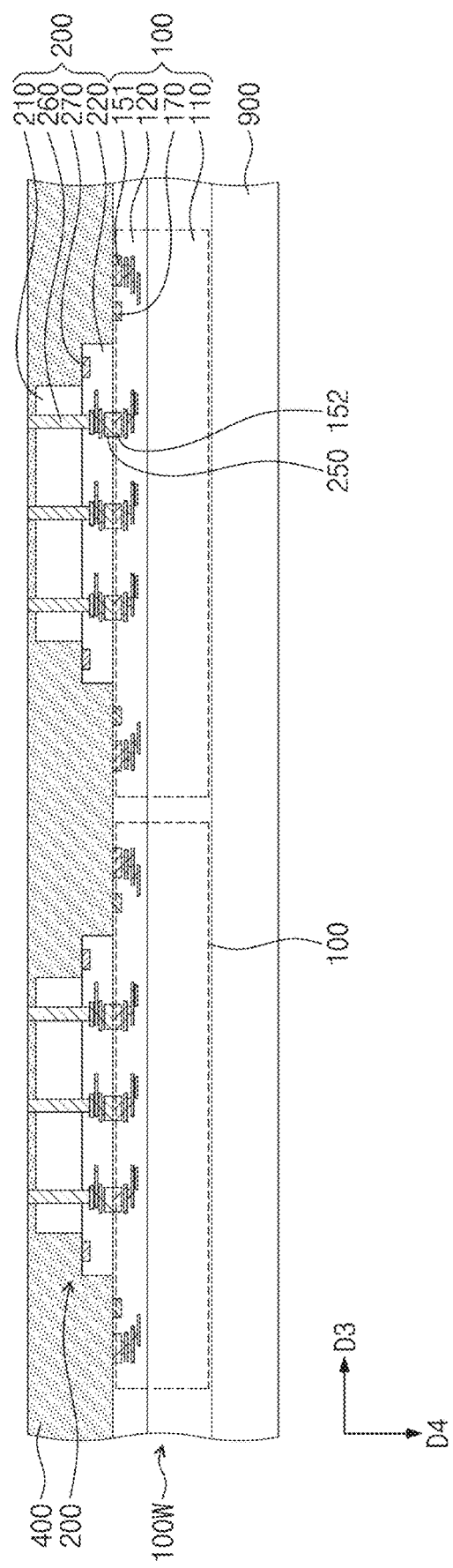

Referring to FIG. 5F, a grinding process may be performed on the insulating sealing layer 400 to remove an upper portion of the insulating sealing layer 400. For example, the grinding process may be a chemical mechanical polishing process. As a result of the grinding process, the penetration vias 260 may be exposed to the outside.

A grinding process on the penetration vias 260 may be further performed to remove upper portions of the penetration vias 260. In some embodiments, the grinding process on the penetration vias 260 may be a process that is distinct from the grinding process on the insulating sealing layer 400. In some embodiments, the grinding process on the penetration vias 260 and the grinding process on the insulating sealing layer 400 may be simultaneously performed through a single process. After the grinding process, the exposed top surfaces of the penetration vias 260 may be provided at substantially the same level as the top surface of the insulating sealing layer 400. The top surfaces of the penetration vias 260 may be provided at a level higher than the top surface of the second semiconductor substrate 210. In some embodiments, and differing from that illustrated in the drawings, the top surfaces of the penetration vias 260 may be provided at substantially the same level as the top surface of the second semiconductor substrate 210. In this case, the insulating sealing layer 400 may not cover the top surface of the second semiconductor chip 200.

Figure 5G:
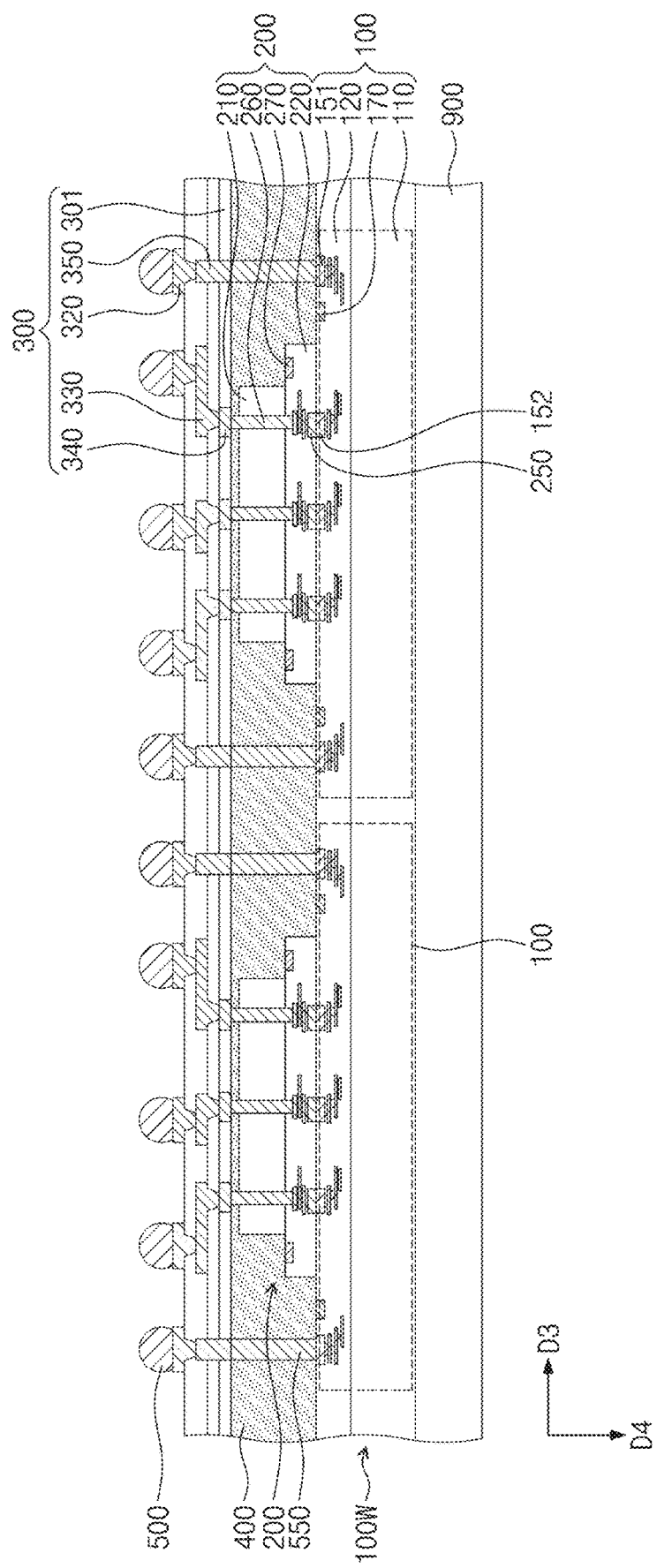

Referring to FIG. 5G, the conductive structures 550 may be formed in the insulating sealing layer 400 and may be coupled to the first conductive chip pads 151. The formation of the conductive structures 550 may include forming holes penetrating the insulating sealing layer 400 and filling the holes with a metallic material. Although not shown, seed patterns may be further formed under bottom surfaces of the conductive structures 550. The conductive structures 550 may be formed by an electroplating process using the seed patterns as a plating electrode.

The redistribution substrate 300 may be formed on the top surfaces of the insulating sealing layer 400 and the penetration vias 260. The formation of the redistribution substrate 300 may be performed by a wafer-level process. The formation of the redistribution substrate 300 may include forming the organic insulating layers 301, forming the first conductive patterns 320, forming the second conductive patterns 330, forming the fourth conductive patterns 350, and forming the third conductive patterns 340.

The solder balls 500 may be formed on the redistribution substrate 300. The formation of the solder balls 500 may include attaching the solder balls 500 to the third conductive patterns 340.

Figure 5H:
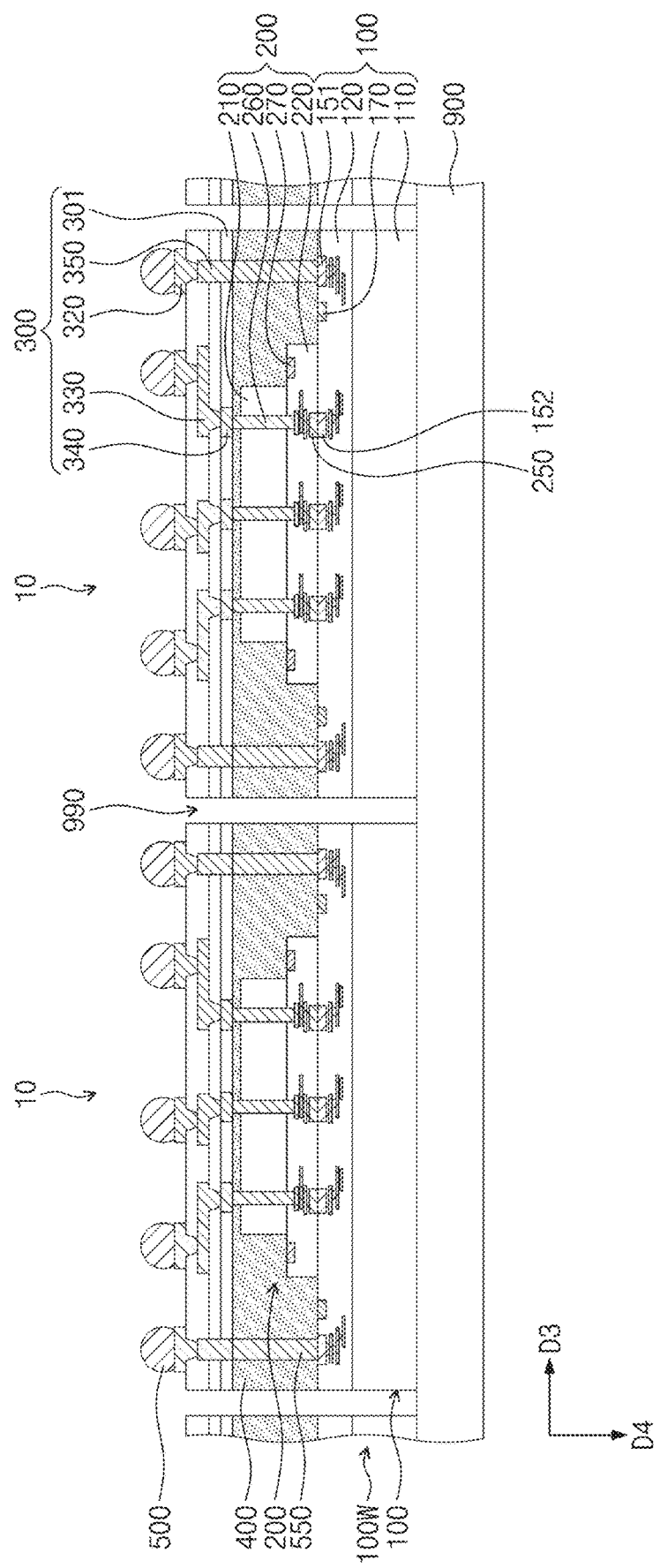

Referring to FIG. 5H, a sawing process may be performed on the redistribution substrate 300, the insulating sealing layer 400, and the semiconductor wafer 100W to form grooves 990. For example, the sawing process may be performed using a blade or laser. The grooves 990 may be formed to penetrate the redistribution substrate 300, the insulating sealing layer 400, and the semiconductor wafer 100W and to expose the temporary substrate 900. The first semiconductor chips 100 may be separated from each other by the grooves 990.

In some embodiments, a sawing process may be performed to divide the semiconductor wafer 100W into a plurality of the semiconductor packages 10. Each of the semiconductor packages 10 may include the first semiconductor chip 100, the second semiconductor chip 200, the conductive structures 550, a corresponding portion of the insulating sealing layer 400, a corresponding portion of the redistribution substrate 300, and the solder balls 500. The temporary substrate 900 may be removed to expose bottom surfaces of the first semiconductor chips 100. Thereafter, the semiconductor packages 10 may be inverted. Accordingly, the fabrication the semiconductor packages 10 may be finished. Each of the semiconductor packages 10 may be substantially the same as the semiconductor package 10 previously described with reference to the embodiments of FIG. 1A to 1D.

In some embodiments, the semiconductor package 10A described in the embodiments of FIGS. 3A and 3B may be fabricated by the method described in the embodiments of FIGS. 5A, 5B, 5E, 5F, 5G, and 5H. However, the second alignment key pattern 270 may be provided between the second dielectric layers 221. As such, the process of etching the first semiconductor substrate 110 and the process of recognizing the first and second alignment key patterns 170 and 270 may be performed as the same method as that described with reference to FIG. 5C.

According to some embodiments of the inventive concepts, a first alignment key pattern may be provided on a bottom surface of an edge region of a first semiconductor chip. The first alignment key pattern may be exposed by a second semiconductor chip. The second semiconductor chip may include a second interconnection layer, a second semiconductor substrate, and a second alignment key pattern. The second alignment key pattern may be provided on an edge region of the second interconnection layer. The second alignment key pattern may be exposed by the second semiconductor substrate.

The first and second alignment key patterns may be inspected to examine whether first and second semiconductor chips are accurately aligned to each other. It may be possible to increase accuracy in the process of examining the alignment between the first and second semiconductor chips.

While example embodiments of the inventive concepts have been particularly shown and described, it will be understood by one of ordinary skill in the art that variations in form and detail may be made therein without departing from the scope of the attached claims.

What is claimed is:

1. A semiconductor package, comprising:
   a redistribution substrate;
   a first semiconductor chip on the redistribution substrate; and
   a second semiconductor chip between the redistribution substrate and the first semiconductor chip, the second semiconductor chip having a second width in a first horizontal direction that is smaller than a first width of the first semiconductor chip in the first horizontal direction,
   wherein the first semiconductor chip comprises a first alignment key pattern on a bottom surface thereof,
   wherein the second semiconductor chip is spaced apart from the first alignment key pattern, and
   wherein the second semiconductor chip comprises:
      a second interconnection layer on the bottom surface of the first semiconductor chip;
      a second semiconductor substrate on a bottom surface of the second interconnection layer and exposing a bottom surface of an edge region of the second interconnection layer; and
      a second alignment key pattern on the edge region of the second interconnection layer.

2. The semiconductor package of claim 1, wherein the first semiconductor chip further comprises:
   a first interconnection layer having a center region and an edge region, when viewed in a plan view; and
   a first bonding chip pad on a bottom surface of the center region of the first interconnection layer,
   wherein the second interconnection layer exposes a bottom surface of the edge region of the first interconnection layer, and
   wherein the first alignment key pattern is on the edge region of the first interconnection layer.

3. The semiconductor package of claim 2, wherein the second semiconductor chip further comprises a second chip pad on a top surface of the second interconnection layer, and
   wherein the second chip pad is directly bonded to the first bonding chip pad.

4. The semiconductor package of claim 1, further comprising an insulating sealing layer between a top surface of the redistribution substrate and the bottom surface of the first semiconductor chip and covering a side surface of the second semiconductor chip.

5. The semiconductor package of claim 4, wherein the insulating sealing layer vertically overlaps the first alignment key pattern and the second alignment key pattern.

6. The semiconductor package of claim 1, wherein the first semiconductor chip further comprises a conductive chip pad on the bottom surface of the edge region of the second interconnection layer, and wherein the conductive chip pad is spaced apart from the first alignment key pattern.

7. The semiconductor package of claim 6, further comprising a conductive structure, which is between the redistribution substrate and the conductive chip pad and which is electrically connected to the conductive chip pad,
   wherein the conductive structure is spaced apart from the second semiconductor chip in a horizontal direction.

8. The semiconductor package of claim 1, wherein the second semiconductor chip further comprises a penetration via in the second semiconductor substrate, and wherein the penetration via is electrically connected to the second interconnection layer and the redistribution substrate.

9. A semiconductor package, comprising:
   a first semiconductor chip including a first semiconductor substrate, a first interconnection layer on a bottom surface of the first semiconductor substrate, and a first alignment key pattern on a bottom surface of an edge region of the first interconnection layer; and
   a second semiconductor chip on a bottom surface of the first interconnection layer and exposing the first alignment key pattern,
   wherein the second semiconductor chip comprises:
      a second interconnection layer that faces the first interconnection layer;
      a second semiconductor substrate on a bottom surface of the second interconnection layer and exposing a bottom surface of an edge region of the second interconnection layer; and
      a second alignment key pattern on the edge region of the second interconnection layer.

10. The semiconductor package of claim 9, further comprising an insulating sealing layer on a bottom surface of the first semiconductor chip to cover a side surface of the second semiconductor chip,
    wherein the insulating sealing layer vertically overlaps the first alignment key pattern and the second alignment key pattern.

11. The semiconductor package of claim 9, wherein the second interconnection layer is directly bonded to the first interconnection layer.

12. The semiconductor package of claim 9, wherein the first semiconductor chip further comprises first integrated circuits,
    wherein the second semiconductor chip further comprises second integrated circuits,
    wherein the first alignment key pattern is electrically isolated from the first integrated circuits, and
    wherein the second alignment key pattern is electrically isolated from the second integrated circuits.

13. The semiconductor package of claim 9, further comprising:
    a redistribution substrate on a bottom surface of the second semiconductor chip; and
    solder balls on a bottom surface of the redistribution substrate.

14. The semiconductor package of claim 9, wherein a second width of the second semiconductor chip in a first horizontal direction is smaller than a first width of the first semiconductor chip in the first horizontal direction, and
    the second semiconductor chip further comprises a penetration via, which penetrates the second semiconductor substrate and is electrically connected to the second interconnection layer.

15. The semiconductor package of claim 9, wherein a width of the edge region of the second interconnection layer is in a range between and including 10 μm to 30 μm.

16. The semiconductor package of claim 9, wherein a width of the second alignment key pattern is in a range between and including 5 μm to 15 μm.

17. A semiconductor package, comprising:
    a redistribution substrate;
    solder balls on a bottom surface of the redistribution substrate;
    a first semiconductor chip on a top surface of the redistribution substrate;

a second semiconductor chip between the redistribution substrate and the first semiconductor chip; and an insulating sealing layer between the top surface of the redistribution substrate and a bottom surface of the first semiconductor chip and covering side surfaces of the second semiconductor chip, wherein the first semiconductor chip comprises:
- a first semiconductor substrate;
- a first interconnection layer on a bottom surface of the first semiconductor substrate;
- a first bonding chip pad provided on a bottom surface of a center region of the first interconnection layer; and
- a first metal dummy pattern provided on a bottom surface of an edge region of the first interconnection layer and electrically isolated from the first bonding chip pad, wherein the second semiconductor chip is spaced apart from the edge region of the first interconnection layer, when viewed in a plan view, and wherein the second semiconductor chip comprises:
- a second interconnection layer on the bottom surface of the center region of the first interconnection layer;
- a second semiconductor substrate on a bottom surface of the second interconnection layer and exposing a bottom surface of an edge region of the second interconnection layer;
- a penetration via in the second semiconductor substrate;
- a second chip pad on a top surface of the second interconnection layer; and
- a second metal dummy pattern on the edge region of the second interconnection layer and electrically isolated from the second chip pad.

18. The semiconductor package of claim 17, wherein the insulating sealing layer covers the first metal dummy pattern and the second metal dummy pattern.

19. The semiconductor package of claim 17, wherein the first metal dummy pattern comprises a first alignment key pattern, and wherein the second metal dummy pattern comprises a second alignment key pattern.

20. The semiconductor package of claim 17, further comprising a conductive structure in the insulating sealing layer, wherein the first semiconductor chip further comprises a conductive chip pad, which is provided on the bottom surface of the edge region of the first interconnection layer and is coupled to the conductive structure, and wherein the first metal dummy pattern is spaced apart from the conductive chip pad.

* * * * *